United States Patent [19]

Ichikawa

[11] Patent Number: 5,461,572
[45] Date of Patent: Oct. 24, 1995

[54] LAYOUT PATTERN VERIFICATION APPARATUS

[75] Inventor: Hiroshi Ichikawa, Itami, Japan

[73] Assignee: Mitsubishi Denki Kabushiki Kaisha, Tokyo, Japan

[21] Appl. No.: 65,904

[22] Filed: May 25, 1993

[30] Foreign Application Priority Data

Jun. 4, 1992 [JP] Japan ..................... 4-143900

[51] Int. Cl.$^6$ .................................................. G06F 17/50
[52] U.S. Cl. ........................................... 364/488; 364/578
[58] Field of Search .................... 364/491, 490, 364/489, 488, 578

[56] References Cited

U.S. PATENT DOCUMENTS

| | | | |
|---|---|---|---|
| 5,062,054 | 10/1991 | Kawakani et al. | 364/491 |
| 5,198,986 | 3/1993 | Ikeda et al. | 364/489 |
| 5,202,841 | 4/1993 | Tani | 364/491 |
| 5,359,534 | 10/1994 | Iujiki et al | 364/489 |

OTHER PUBLICATIONS

"Resistance Extraction in a Hierarchical IC At Work Verification System", by Mori et al., IEEE 1985, pp. 196–198.
"LAS: Layout Pattern Analysis System with New Approach", by Okamura et al, IEEE 1982, pp. 308–311.

*Primary Examiner*—Vincent N. Trans
*Attorney, Agent, or Firm*—Oblon, Spivak, McClelland, Maier & Neustadt

[57] ABSTRACT

A layout pattern verification apparatus which can automatically verify surge breakdown resistance. An input resistance verification module (3), an input resistance contact verification module (4) and an input resistance periphery verification module (5) incorporate an input resistance verification rule (55) and layout information (57) provided with input/output information, verify surge breakdown resistance on an input resistance itself, an input resistance contact region and the input resistance and its peripheral region, and output verification result information to a verification result output module (6). It is possible to automatically verify surge breakdown resistance with attention being drawn to a layout pattern of the input resistance causing surge breakdown.

25 Claims, 23 Drawing Sheets

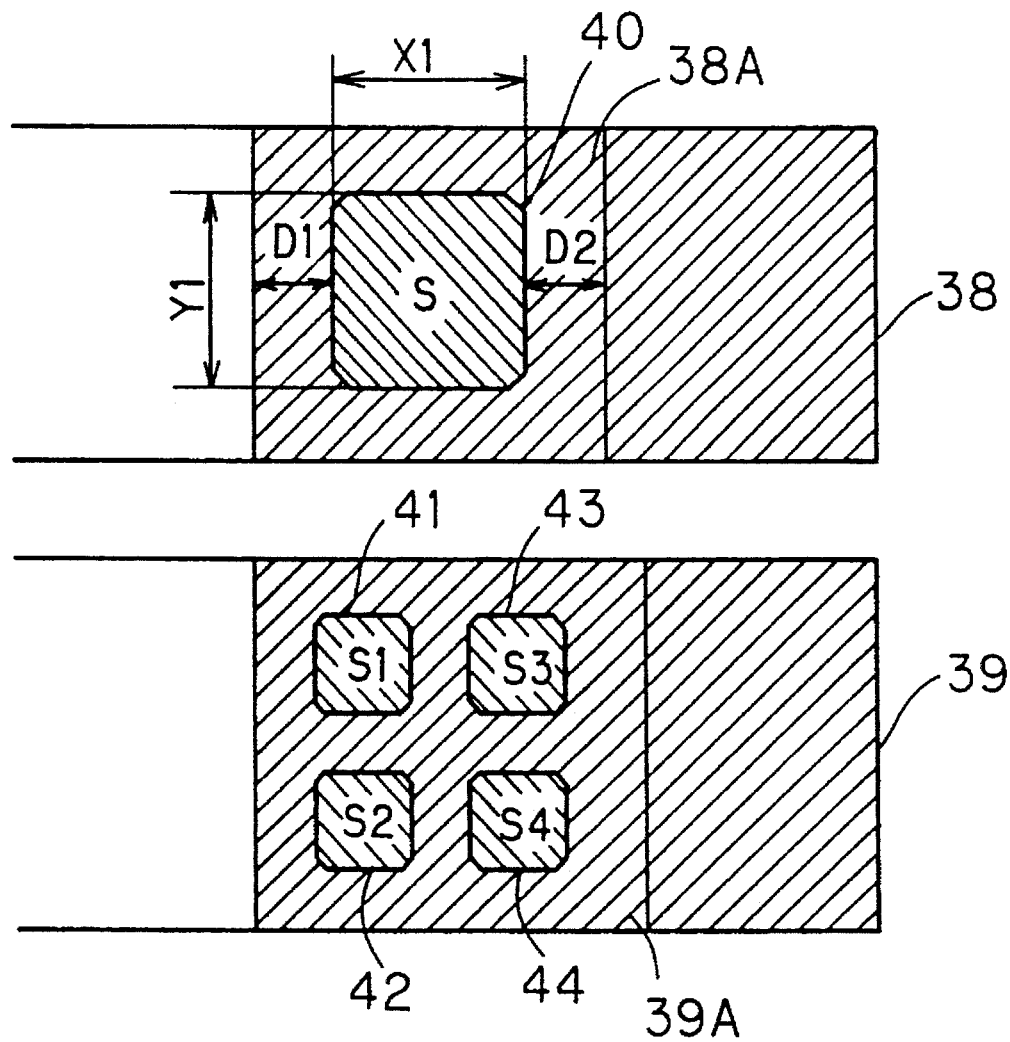

: 
LAYOUT PATTERN VERIFICATION APPARATUS

BACKGROUND OF THE INVENTION

1. Field of the Invention

The present invention relates to a layout pattern verification apparatus for verifying surge breakdown resistance in the layout pattern of a semiconductor integrated circuit.

2. Description of the Background Art

FIG. 28 is a block diagram showing the structure of a conventional layout pattern verification apparatus. Referring to FIG. 28, a layout information extraction module 101 incorporates layout pattern data 151 and a layout information extraction rule 152, and outputs layout information 153 to a design rule verification module 102. The layout pattern data 151 define the structure of a semiconductor integrated circuit (IC), while the layout information extraction rule 152 stores a device recognition rule, circuit connection information as to types and manners of connection of devices and the like in a rule system. The layout information 153 is obtained by adding device information, the circuit connection information and the like to the layout pattern data 151.

The design rule verification module 102 incorporates the layout information 153 and the verification rule 154, and outputs verification result information based on the verification rule 154 with respect to the layout information 153 to a verification result output module 103. The verification rule 154 defines reference values for geometrically verifying various values such as formation widths of devices on the layout pattern, device spaces and the like.

On the basis of the verification result information obtained from the design rule verification module 102, the verification result output module 103 outputs verification result display data 155 to a display module 104 such as a display unit, to graphically display the verification result on the display module 104.

FIG. 29 is a flow chart showing a verification operation of the layout pattern verification apparatus shown in FIG. 28.

Referring to FIG. 29, the layout information extraction module 101 incorporates the layout pattern data 151 and the layout information extraction rule 152 and outputs the layout information 153, which is obtained by adding device information, circuit connection information and the like to the layout pattern data 151 on the basis of the layout information extraction rule 152, to the design rule verification module 102 at a step S101.

At a step S102, the design rule verification module 102 incorporates the layout information 153 and the verification rule 154, verifies a geometric design rule on a layout pattern defined by the layout information 153 on the basis of the verification rule 154, and outputs verification result information to the verification result output module 103.

At a step S103, the verification result output module 103 outputs the verification result display data 155 to the display module 104 on the basis of the verification result information obtained at the step S102, thereby displaying the verification result display data 155 on the display module 104.

The conventional layout pattern verification apparatus having the aforementioned structure merely verifies the layout pattern on the basis of the common geometric verification rule and reference values defined by the verification rule 154 with respect to the layout pattern to be verified.

In order to verify surge breakdown resistance for recognizing the degree of occurrence of surge breakdown in an integrated circuit, it is necessary to direct attention to input and output circuit parts of the integrated circuit and apply a specific geometric design rule to the input and output circuit parts.

As hereinabove described, however, the conventional layout pattern verification apparatus uniformly verifies the layout pattern in every portion of the integrated circuit, and applies no specific geometric design rule to the input and output circuit parts.

Therefore, presence/absence of surge breakdown must be visually verified through a display of the layout pattern or the like. Thus, accuracy of such verification depends on the verifier, leading to dispersion and frequent verification errors.

Thus, the conventional layout pattern verification apparatus performs absolutely no surge breakdown verification.

SUMMARY OF THE INVENTION

According to the present invention, a layout pattern verification apparatus comprises layout information providing means for providing layout information obtained by adding device information and circuit connection information to a layout pattern defining the structure of a semiconductor integrated circuit, input circuit information addition means receiving the layout information and identifying an input circuit from the layout information for outputting layout information provided with input circuit information, verification rule providing means for providing a surge breakdown resistance verification rule on a layout pattern in relation to an input resistance in the input circuit, and surge breakdown resistance verification means receiving the layout information provided with input circuit information and the surge breakdown resistance verification rule for verifying surge breakdown resistance on the layout pattern of the input resistance in the input circuit defined by the layout information provided with input circuit information with reference to the surge breakdown resistance verification rule.

Preferably, the surge breakdown resistance verification rule includes a first rule related to the resistance value and the shape of a corner portion of the input resistance.

Preferably, the surge breakdown resistance verification rule includes a second rule related to a width and an area of a contact region provided in the input resistance and a margin distance between the same and the input resistance.

Preferably, the surge breakdown resistance verification rule includes a third rule related to a distance on a plane between the input resistance and a conductive region which is provided on a different layer.

Preferably, the surge breakdown resistance verification means includes input resistance verification means for verifying surge breakdown resistance on the layout pattern of the input resistance itself which is defined by the layout information provided with input circuit information with reference to the first rule of the surge breakdown resistance verification rule, input resistance contact verification means for verifying surge breakdown resistance on a layout pattern related to the contact region of the input resistance which is defined by the layout information provided with input circuit information with reference to the second rule of the surge breakdown resistance verification rule, and input resistance periphery verification means for verifying surge breakdown resistance on the layout pattern of the input resistance which is defined by the layout information provided with input circuit information and its periphery with reference to the third rule of the surge breakdown resistance verification rule.

Preferably, the layout pattern verification apparatus further includes display means for displaying a surge breakdown resistance verification result on the basis of a result of verification by the surge breakdown resistance verification means.

Preferably, the input circuit information addition means extracts an external signal pad for identifying a circuit which is formed by an element connected to a wire extending from the external signal pad toward a gate of a transistor as the input circuit when the pad is connected to the gate of the transistor.

According to another aspect of the present invention, a layout pattern verification apparatus comprises layout information providing means for providing layout information obtained by adding device information and circuit connection information to a layout pattern defining the structure of a semiconductor integrated circuit, input circuit information addition means receiving the layout information and identifying an input circuit from the layout information for outputting layout information provided with input circuit information, verification rule providing means for providing a surge breakdown resistance verification rule on a layout pattern related to an input diode in the input circuit, and surge breakdown resistance verification means receiving the layout information provided with input circuit information and the surge breakdown verification rule for verifying surge breakdown resistance on a layout pattern of the input diode in the input circuit which is defined by the layout information provided with input circuit information with reference to the surge breakdown resistance verification rule.

Preferably, the surge breakdown resistance verification rule includes a first rule related to an area and the shape of a corner portion of an input diode diffusion region which is a diffusion region forming the input diode.

Preferably, the surge breakdown resistance verification rule includes a second rule related to a width and an area of a contact region provided in the input diode diffusion region and a margin distance between the same and the diffusion region.

Preferably, the surge breakdown resistance verification rule includes a third rule defining a layer to be provided with a power supply wire and a ground wire which is connected to the input diode diffusion region.

Preferably, the surge breakdown resistance verification rule includes a fourth rule related to geometric positions of the input diode diffusion region and a peripheral region thereof.

Preferably, the surge breakdown resistance verification means recognizes a second electrode region of a P-channel transistor, having a control electrode and a first electrode connected to a power supply, and a second electrode region of an N-channel transistor, having a first electrode connected to a ground level, as diodes.

Preferably, the surge breakdown resistance verification means includes input diode verification means for verifying surge breakdown resistance on the layout pattern of the input diode diffusion region itself which is defined by the layout information provided with input circuit information with reference to the first rule of the surge breakdown resistance verification rule, input diode contact verification means for verifying surge breakdown resistance on a layout pattern related to the contact region of the input diode diffusion region defined by the layout information provided with input circuit information with reference to the second rule of the surge breakdown resistance verification rule, input diode interconnection layer verification means for verifying surge breakdown resistance on a layout pattern related to the power supply wire and the ground wire connected to the input diode diffusion region defined by the layout information provided with input circuit information with reference to the third rule of the surge breakdown resistance verification rule, and input diode periphery verification means for verifying surge breakdown resistance on the layout pattern of the input diode diffusion region defined by the layout information provided with input information and its periphery with reference to the fourth rule of the surge breakdown resistance verification rule.

Preferably, the layout pattern verification apparatus further comprises display means for displaying a surge breakdown resistance verification result on the basis of a result of verification by the surge breakdown resistance verification means.

According to still another aspect of the present invention, a layout pattern verification apparatus comprises layout information providing means for providing layout information obtained by adding device information and circuit connection information to a layout pattern defining the structure of a semiconductor integrated circuit, output circuit information addition means receiving the layout information and identifying an output circuit from the layout information for outputting layout information provided with output circuit information, verification rule providing means for providing a surge breakdown resistance verification rule on a layout pattern related to an output buffer in the output circuit, and surge breakdown resistance verification means receiving the layout information provided with output circuit information and the surge breakdown resistance verification rule for verifying surge breakdown resistance on the layout pattern of the output buffer in the output circuit defined by the layout information provided with output circuit information with reference to the surge breakdown resistance rule.

Preferably, the surge breakdown resistance verification rule includes a first rule related to an area and the shape of a corner portion of an output buffer diffusion region which is a diffusion region forming the output buffer.

Preferably, the surge breakdown resistance verification rule includes a second rule related to a width and area of a contact region provided in the output buffer diffusion region and a margin distance between the same and the output buffer diffusion region.

Preferably, the surge breakdown resistance verification rule includes a third rule defining a layer to be provided with a power supply wire and a ground wire which is connected to the output buffer diffusion region.

Preferably, the surge breakdown resistance verification rule includes a fourth rule related to geometric positions of the output buffer diffusion region and a peripheral region.

Preferably, the output buffer diffusion region is a diffusion region which is connected to any one of an output pad, a power supply and the ground among diffusion regions forming the output buffer.

Preferably, the surge breakdown resistance verification means includes output buffer verification means for verifying surge breakdown resistance on the layout pattern of the output buffer diffusion region itself which is defined by the layout information provided with output circuit information with reference to the first rule of the surge breakdown resistance verification rule, output buffer contact verification means for verifying surge breakdown resistance on a layout pattern related to the contact region of the output buffer diffusion region defined by the layout information provided with output circuit information with reference to the second rule of the surge breakdown resistance verification rule, output buffer interconnection layer verification means for verifying surge breakdown resistance on a layout pattern related to the power supply wire and the ground wire which is connected to the output buffer diffusion region defined by the layout information provided with output circuit information with reference to the third rule of the surge breakdown resistance verification rule, and output buffer periphery verification means for verifying surge breakdown resistance on the layout pattern of the output buffer diffusion region and its periphery which is defined by the layout information provided with output circuit information with reference to the fourth rule of the surge breakdown resistance verification rule.

Preferably, the layout pattern verification apparatus further comprises display means for displaying a result of surge breakdown resistance verification on the basis of a result of verification by the surge breakdown resistance verification means.

According to a further aspect of the present invention, a layout pattern verification apparatus comprises layout information providing means for providing layout information obtained by adding device information and circuit connection information to a layout pattern defining the structure of a semiconductor integrated circuit, input/output circuit information addition means receiving the layout information and identifying an input/output circuit from the layout information for outputting layout information provided with input/output circuit information, and surge breakdown resistance verification means receiving the layout information provided with input/output circuit information for verifying surge breakdown resistance by verifying presence/absence of another wire planarly intersecting with a layout pattern of an input wire and an output wire in the input/output circuit defined by the layout information provided with input/output circuit information.

Preferably, the layout pattern verification apparatus further comprises display means for displaying a result of surge breakdown resistance verification on the basis of a result of verification by the surge breakdown resistance verification means.

In the layout pattern verification apparatus according to the first aspect of the present invention, the surge breakdown verification means can verify surge breakdown resistance with attention drawn to the layout pattern of the input resistance causing surge breakdown by receiving the layout information provided with input circuit information and the surge breakdown resistance verification rule and referring to the surge breakdown resistance verification rule with respect to the layout pattern of the input resistance in the input circuit defined by the layout information provided with input circuit.

In the layout pattern verification apparatus according to the second aspect of the present invention, the surge breakdown resistance verification means can verify surge breakdown resistance with attention drawn to the layout pattern of the input diode causing surge breakdown by receiving the layout information provided with input circuit information and the surge breakdown resistance verification rule and referring to the surge breakdown resistance verification rule with respect to the layout pattern of the input diode in the input circuit defined by the layout information provided with input circuit information.

In the layout pattern verification apparatus according to the third aspect of the present invention, the surge breakdown resistance verification means can verify surge breakdown resistance with attention drawn to the output buffer causing surge breakdown by receiving the layout information provided with output circuit information and the surge breakdown resistance verification rule and referring to the surge breakdown resistance verification rule with respect to the layout pattern of the output buffer in the output circuit defined by the layout information provided with output circuit information.

In the layout pattern verification apparatus according to the fourth aspect of the present invention, the surge breakdown resistance verification means can verify surge breakdown resistance with attention drawn to input and output wires causing surge breakdown by receiving the layout information provided with input/output information and the surge breakdown resistance verification rule and verifying presence/absence of another wire planarly intersecting with the layout pattern of the input and output wires in the input/output circuit defined by the layout information provided with input/output circuit information.

Accordingly, an object of the present invention is to obtain a layout pattern verification apparatus which can automatically verify surge breakdown resistance.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a plan view for illustrating the operation of an input resistance contact verification module in the layout pattern verification apparatus according to the first embodiment;

DESCRIPTION OF THE PREFERRED EMBODIMENTS

Figure 1:
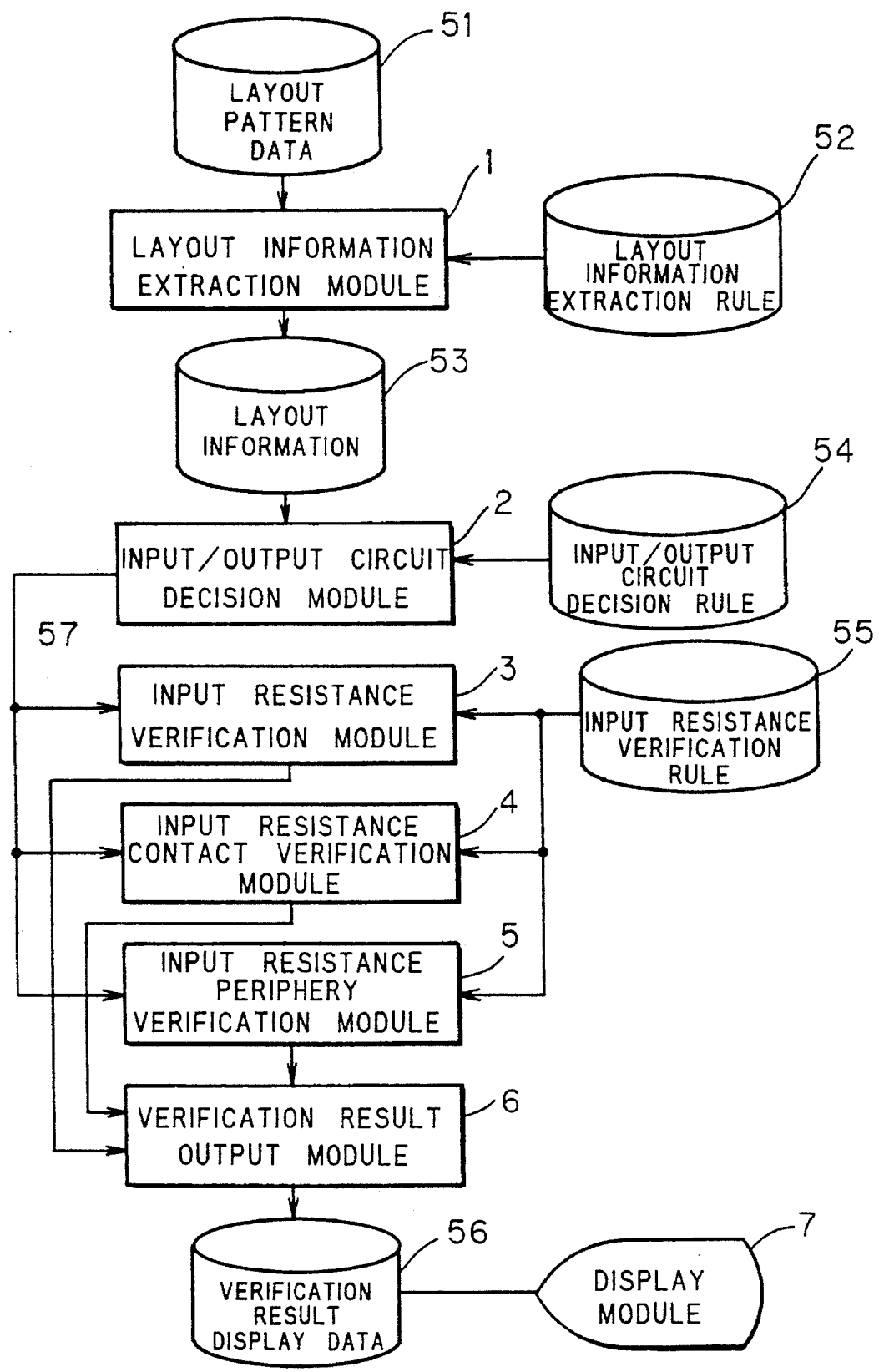
FIG. 1 is a block diagram showing the structure of a layout pattern verification apparatus according to a first embodiment of the present invention.

FIG. 1 is a block diagram showing the structure of a layout pattern verification apparatus according to a first embodiment of the present invention. As shown in FIG. 1, a layout information extraction module 1 incorporates layout pattern data 51 and a layout information extraction rule 52, and outputs layout information 53 to an input/output circuit decision module 2. The layout pattern data 51 define the structure of a semiconductor integrated circuit (IC), and the layout information extraction rule 52 stores a device recognition rule, circuit connection information as to types and manners of connection of devices and the like in a rule system. The layout information 53 is obtained by adding device information and the circuit connection information to the layout pattern data 51.

The input/output circuit decision module 2 incorporates the layout information 53 and the input/output circuit decision rule 54, and outputs layout information 57 provided with input/output circuit information obtained by adding input/output circuit information to the layout information 53 on the basis of the input/output circuit decision rule 54. The input/output circuit decision rule 54 defines conditions for deciding an input/output circuit part from the layout information 57.

An input resistance verification module 3 incorporates an input resistance verification rule 55 and the layout information 57 provided with input/output information for verifying presence/absence of an input resistance such as a diffusion resistance or a polysilicon resistance in a layout pattern of the input/output circuit part defined by the layout information 57 provided with input/output information and verifying the shape, the resistance value etc. of the input resistance if the same is present thereby verifying surge breakdown resistance on the input resistance itself, and outputs verification result information to a verification result output module 6. If no input resistance is present, on the other hand, it outputs a surge breakdown resistance error to the verification result output module 6 as a verification result output. The input resistance verification rule 55 is provided from input resistance verification rule providing means (not shown).

An input resistance contact verification module 4 incorporates the input resistance verification rule 55 and the layout information 57 provided with input/output information for verifying the shape, area etc. of a contact part of the input resistance in the layout pattern of the input/output circuit part defined by the layout information 57 provided with input/output information thereby verifying surge breakdown resistance on the input resistance contact region, and outputs verification result information to the verification result output module 6.

An input resistance periphery verification module 5 incorporates the input resistance verification rule 55 and the layout information 57 provided with input/output information for verifying geometrical positional relation between the layout pattern of the input/output circuit part defined by the layout information 57 provided with input/output information and a peripheral part of the input resistance thereby verifying surge breakdown resistance of the input resistance and its peripheral region, and outputs verification result information to the verification result output module 6.

On the basis of the verification result information obtained from the input resistance verification module 3, the input resistance contact verification module 4 and the input resistance periphery verification module 5, the verification result output module 6 outputs verification result display data 56 for surge breakdown resistance verification to a display module 7 such as a display unit, thereby graphically displaying the verification result information on the display module 7.

Figure 2:
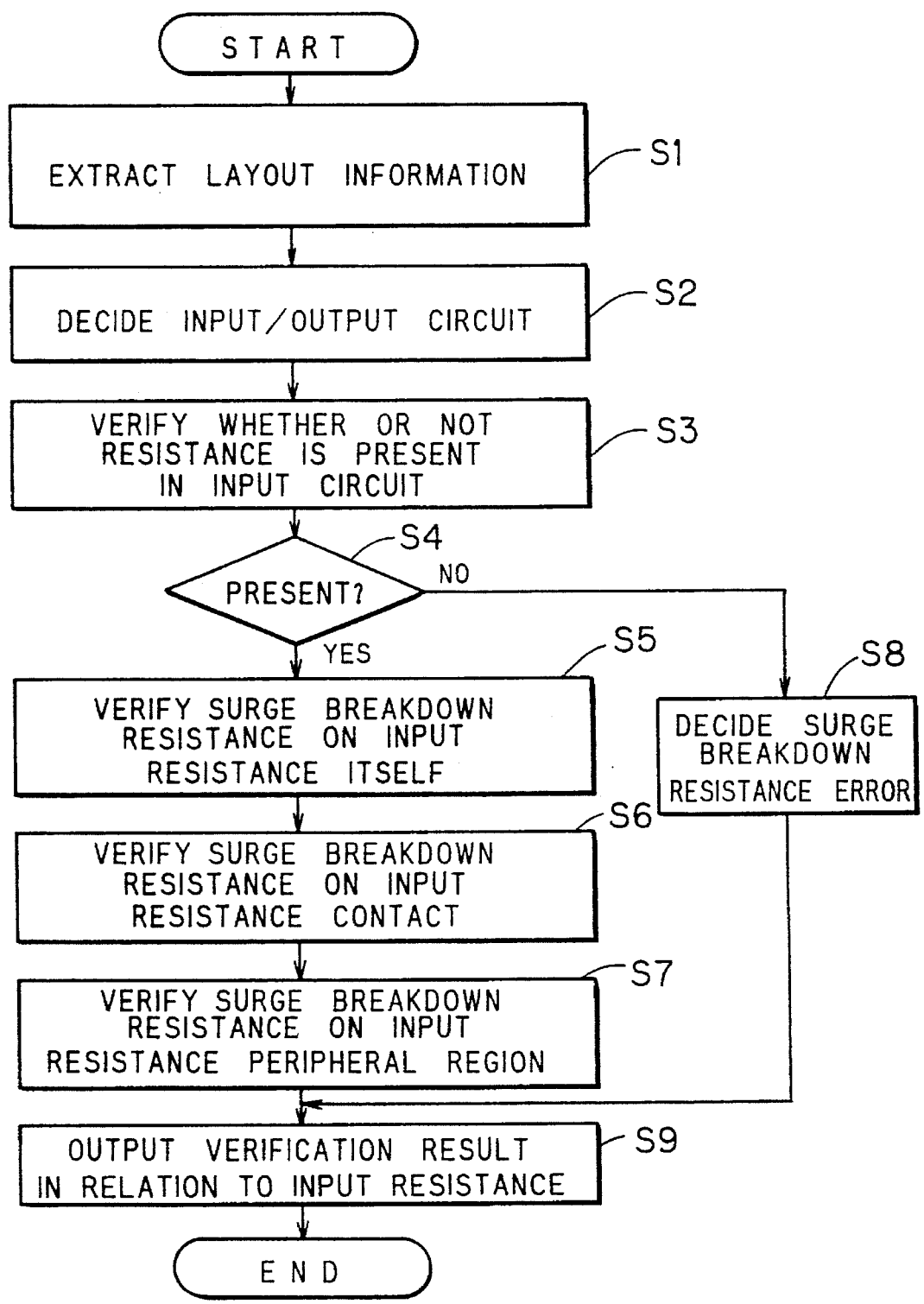
FIG. 2 is a flow chart showing a surge breakdown resistance verification operation of the layout pattern verification apparatus according to the first embodiment.

FIG. 2 is a flow chart showing a verification operation of the layout pattern verification apparatus according to the first embodiment.

Referring to FIG. 2, the layout information extraction module 1 incorporates the layout pattern data 51 and the layout information extraction rule 52 and outputs the layout information 53, which is obtained by adding device information, circuit connection information etc. to the layout pattern 51 on the basis of the layout information extraction rule 52, to the input/output decision module 2 at a step S1.

At a step S2, the input/output circuit decision module 2 incorporates the layout information 53 and the input/output circuit decision rule 54, identifies the input/output circuit part in the layout pattern defined by the layout information 53, and outputs the layout information 57 provided with input/output information to the input resistance verification module 3.

Figure 3:
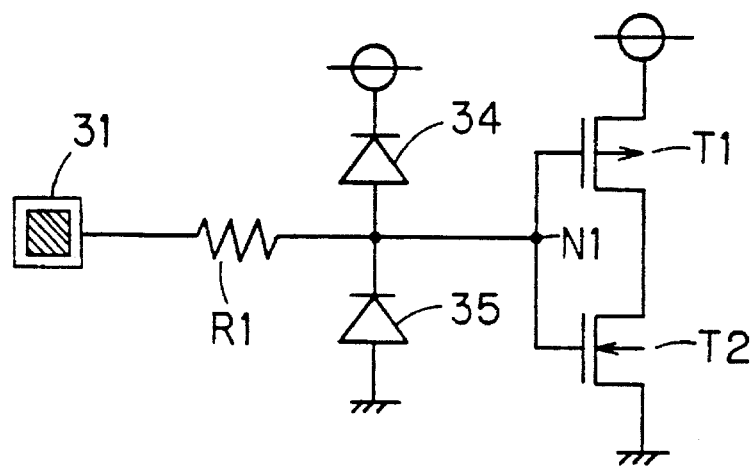
FIG. 3 is a circuit diagram for illustrating the operation of an input/output circuit decision module in the layout pattern verification apparatus according to the first embodiment.
Figure 4:
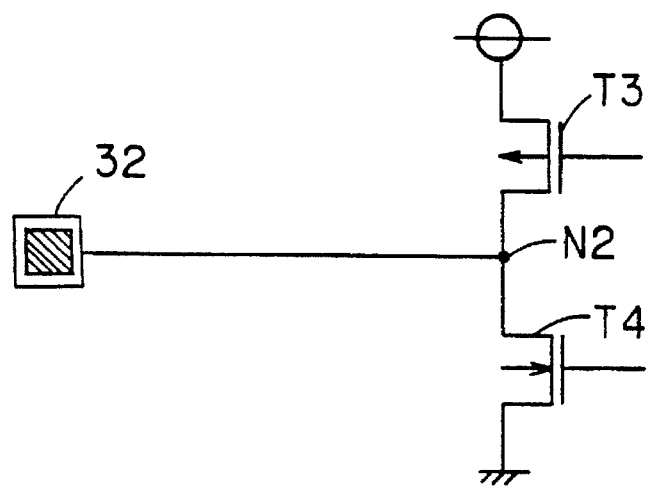
FIG. 4 is a circuit diagram for illustrating the operation of the input/output circuit decision module in the layout pattern verification apparatus according to the first embodiment.
Figure 5:
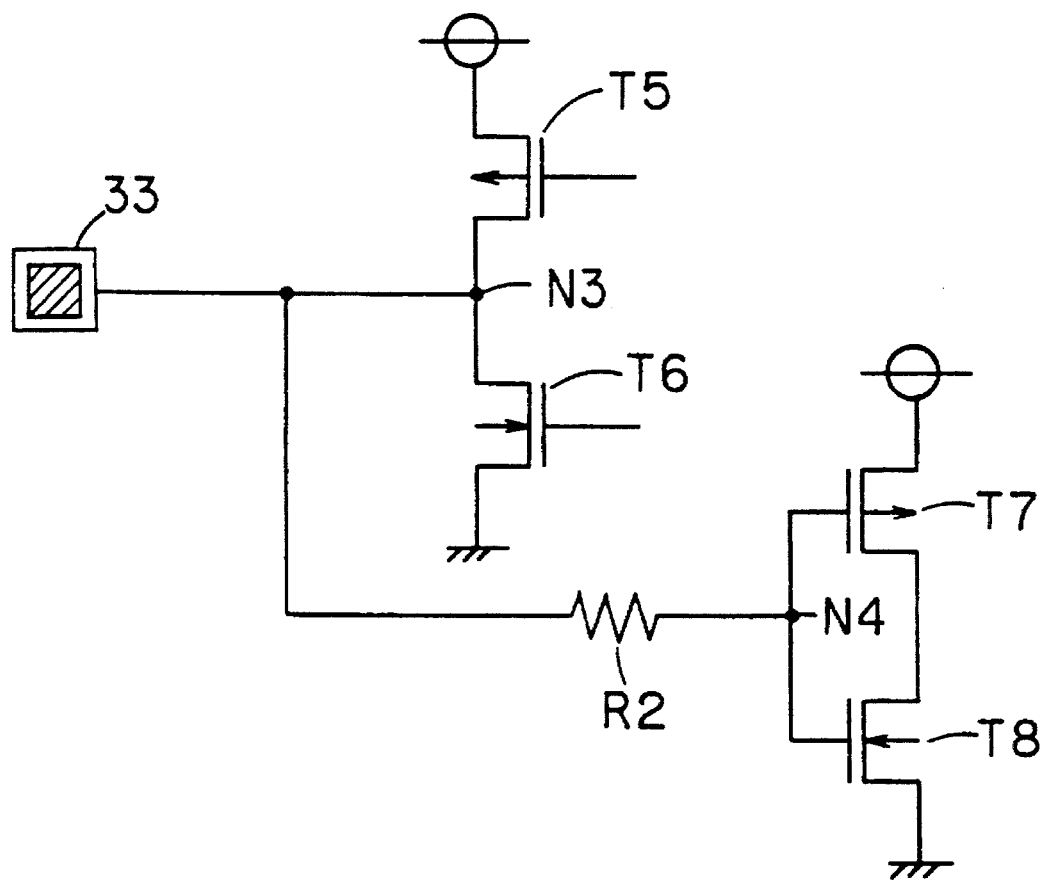
FIG. 5 is a circuit diagram for illustrating the operation of the input/output circuit decision module in the layout pattern verification apparatus according to the first embodiment.

FIGS. 3 to 5 are circuit diagrams for illustrating the identification operation of the input/output circuit decision module 2. The input/output circuit decision module 2 extracts an input circuit in the following manner:

First, it extracts an external signal pad, traces a node which is connected to the pad, and decides an input circuit including a wire extending from the pad toward a gate of a transistor and an element connected to the wire when the traced node is connected to the gate of the transistor. Referring to FIG. 3, a node N1 which is connected to a pad 31 through a resistance R1 is connected to gates of transistors T1 and T2, whereby a circuit formed by the pad 31, the resistance R1, diodes 34 and 35 and the transistors T1 and T2 is decided as an input circuit.

On the other hand, the input/output circuit decision module 2 extracts an output circuit in the following manner: First, it extracts an external signal pad and traces a node which is connected to the pad, and decides an output circuit when the traced node is connected to a drain of a transistor. Referring to FIG. 4, a node N2 which is directly connected to a pad 32 is connected to drains of a P-channel transistor T3 and an N-channel transistor T4, whereby a circuit formed by the pad 32 and the transistors T3 and T4 is decided as an output circuit.

Referring to FIG. 5, a node N3 which is directly connected to a pad 33 is connected to drains of a P-channel transistor T5 and an N-channel transistor T6, whereby a circuit formed by the pad 33 and the transistors T5 and T6 is decided as an output circuit, while a circuit formed by the pad 33, a resistance R2 and transistors T7 and T8 is decided as an input circuit since a node N4 which is connected to the pad 33 through the resistance R2 is connected to gates of the transistors T7 and T8.

After termination of the step S2 shown in FIG. 2, presence/absence of an input wire resistance (input resistance) in the input circuit part in the layout pattern of the input/output circuit part defined by the layout information 57 provided with input/output information is verified at a step S3, so that a step S4 branches to a step S5 upon presence of an input resistance, or to a step S6 upon presence of no input resistance.

At the step S5, the input resistance verification module 3 verifies surge breakdown resistance on the input resistance itself by verifying its shape, resistance value and the like, and outputs verification result information to the verification result output module 6. The surge breakdown resistance verification operation on the input resistance itself is now described in detail.

Figure 6A:
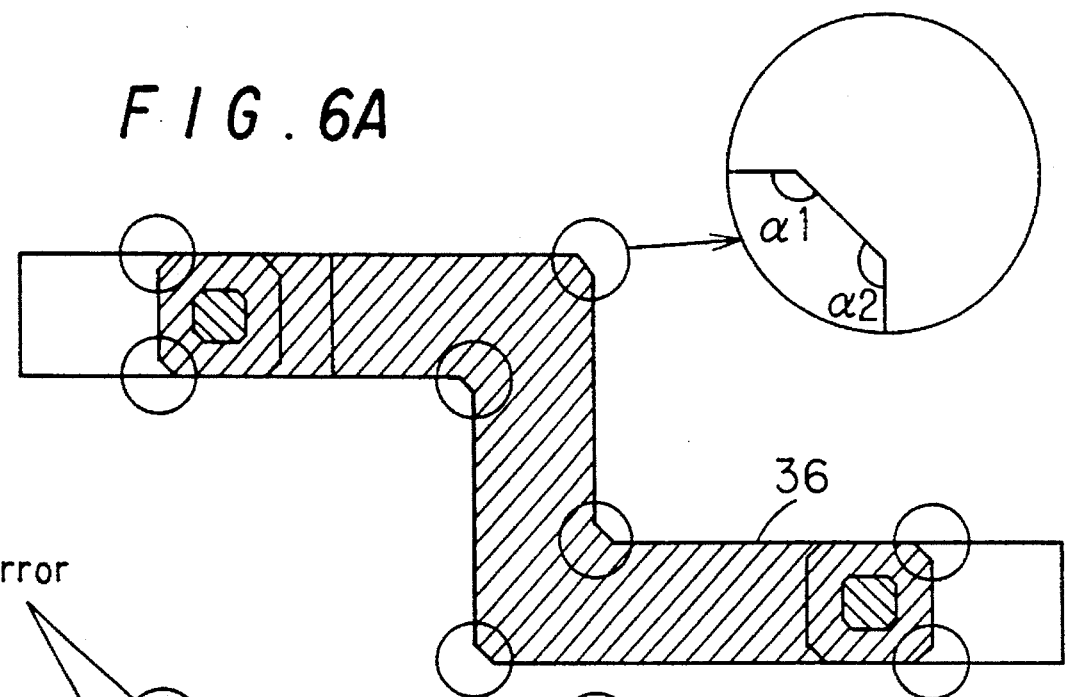
FIG. 6 is a plan view for illustrating the operation of an input resistance verification module in the layout pattern verification apparatus according to the first embodiment.
Figure 6B:
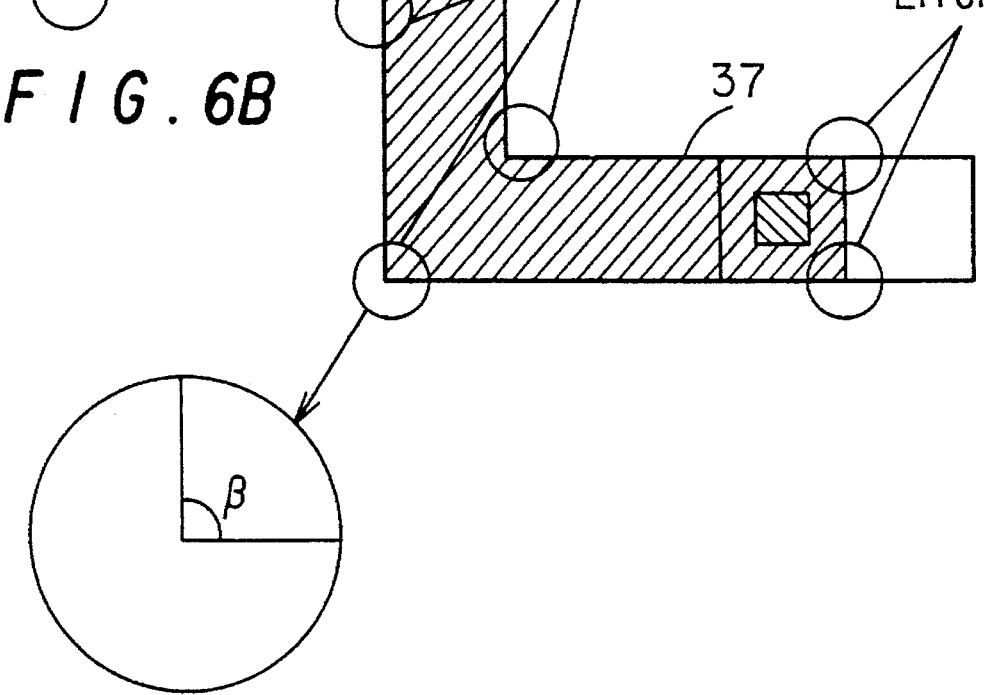

FIG. 6 is a plan view for illustrating the input resistance verification operation. Referring to FIG. 6, numerals 36 and 38 denote resistance regions which are formed by diffusion or polysilicon regions. The input resistance verification module 3 notes corner portions (encircled in FIG. 6) of such resistance regions 36 and 37 and verifies resistance formation angles at the corner portions, to decide that field concentration is hardly caused in the corner portions with a small possibility of surge breakdown if the formation angles exceed 90°, while deciding that field concentration may be caused on the corner portions with a possibility of surge breakdown if the formation angles are not more than 90°. Referring to FIG. 6, the module 3 decides that the corner portions of the resistance region 36 having formation angles $\alpha 1$ and $\alpha 2$ exceeding 90° have small possibilities of surge breakdown and that the corner portions of the resistance region 37 having formation angles $\beta$ of 90° have possibilities of causing surge breakdown by field concentration with errors in surge breakdown resistance.

The input resistance verification module 3 also verifies surge breakdown resistance by calculating resistance values of the respective resistance regions from specific resistances obtained from the input resistance verification rule 55 and comparing the calculated resistance values of the resistance regions with a reference value obtained from the input resistance verification rule 55.

After termination of the step S5 shown in FIG. 2, the input resistance contact verification module 4 incorporates the input resistance verification rule 55 and the layout information 57 provided with input/output information, verifies surge breakdown resistance on the input resistance contact region in the layout pattern of the input/output circuit part defined by the layout information 57 provided with input/output information, and outputs verification result information to the verification result output module 6 at a step S6. This surge breakdown resistance verification operation is now described in detail.

FIG. 7 is a plan view for illustrating the input resistance contact verification operation. Referring to FIG. 7, numerals 38 and 39 denote resistance regions, and numerals 38A and 39A denote interconnection overlap regions planarly overlapping with other interconnection layers (provided on a layer different from that provided with the resistance regions 38 and 39) of aluminum etc. which must be electrically connected to the resistance regions 38 and 39 respectively. Numerals 40 and 41 to 44 denote contact regions of the resistance regions 38 and 39 respectively. Symbols X1 and Y1 denote formation widths of the contact region 40, and symbols D1 and D2 denote contact margin distances between the interconnection overlap region 38A and the contact region 40.

The input resistance contact verification module 4 verifies surge breakdown resistance depending on whether or not formation angles of the corner portions in the contact regions of the input resistance exceed 90°, similarly to the verification of the corner portions in the input resistance itself.

Further, the input resistance contact verification module 4 detects widths (corresponding to X1 and Y1 in FIG. 7) of each contact region from the layout information 57 provided with input/output information and compares the detected widths with reference values obtained from the input resistance verification rule 55, to verify surge breakdown resistance. In more concrete terms, it regards that there is a high possibility of surge breakdown caused by field concentration in narrow regions of the contact region upon occurrence of a surge if the widths of the contact region are below the reference values, and decides a surge breakdown resistance error.

The input resistance contact verification module 4 further detects contact margin distances (corresponding to D1 and D2 in FIG. 7) from the layout information 57 provided with input/output information and compares the detected widths and margin distances with reference values obtained from the input resistance verification rule 55, to verify surge breakdown resistance. In more concrete terms, it regards that there is a high possibility of imperfect contact upon occurrence of a surge if the contact margin distances are below the reference values, to decide a surge breakdown resistance error.

In addition, the input resistance contact verification module 4 further calculates the formation area of each contact region and compares the calculated area with a reference value obtained from the input resistance verification rule 55. In more concrete terms, it regards that surge breakdown easily results from field concentration caused in the contact region upon occurrence of a surge if the formation area of the contact region is below the reference value, and decides a surge breakdown resistance error. If contact is attained through a plurality of contact regions 41 to 44 as shown in the resistance region 39 appearing in FIG. 7, it compares the total sum of the areas of the contact regions with the reference value obtained from the input resistance verification rule 55 and verifies surge breakdown resistance.

After termination of the step S6 shown in FIG. 2, the input resistance periphery verification module 5 incorporates the input resistance verification rule 55 and the layout information 57 provided with input/output information at a step S7, verifies surge breakdown resistance on an input resistance peripheral region in the layout pattern of the input/output circuit part defined by the layout information 57 provided with input/output information, and outputs verification result information to the verification result output module 6. This surge breakdown resistance verification operation is now described in detail.

Figure 8A:
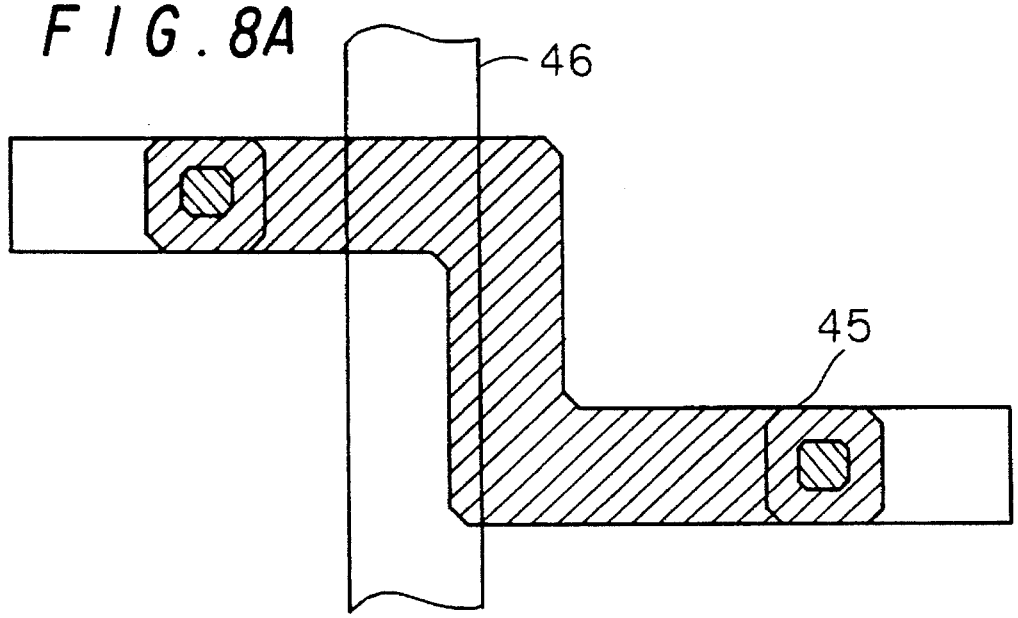
FIG. 8 is a plan view for illustrating the operation of an input resistance periphery verification module in the layout pattern verification apparatus according to the first embodiment.
Figure 8B:
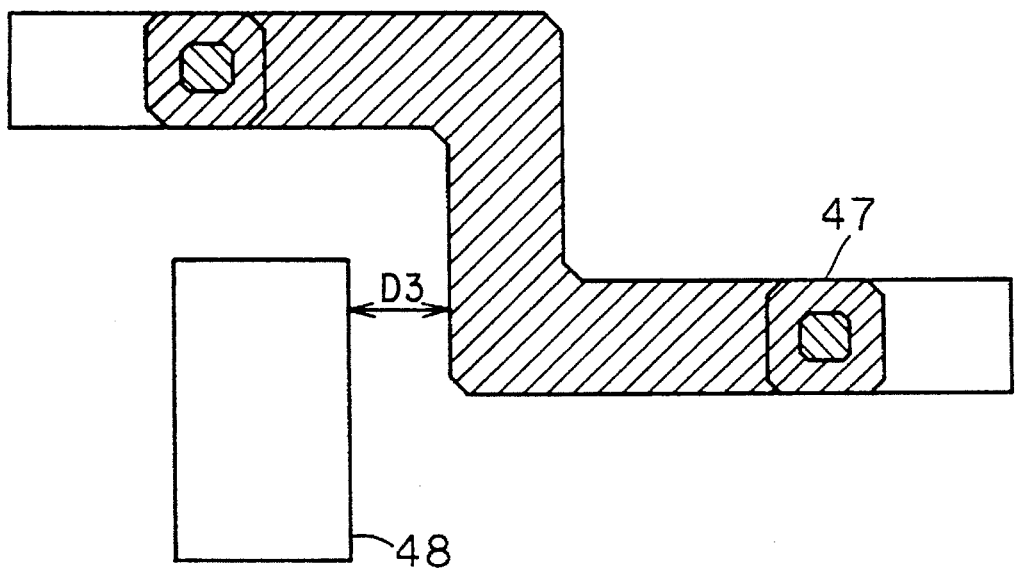

FIG. 8 is a plan view for illustrating the surge breakdown verification operation for the input resistance peripheral region. Referring to FIG. 8, numerals 45 and 47 denote resistance regions, and numerals 46 and 48 denote other interconnection layers which are formed on layers different from those of the resistance regions 45 and 47 respectively.

The input resistance periphery verification module 5 measures the plane distance between each resistance region and the interconnection layer which is formed on a layer different from that of the resistance region and compares the measured plane distance with a reference value obtained from the input resistance verification rule 55, to verify surge breakdown resistance. In more concrete terms, it regards that an influence is exerted by potential change of the resistance region upon occurrence of a surge when the plane distance is smaller than the reference value, and decides a surge breakdown resistance error. Referring to FIG. 8, the plane distance between the resistance region 45 and the interconnection layer 46 is zero, i.e., clearly below the reference value, and hence the module 5 decides a surge breakdown resistance error. The module 5 further compares a plane distance D3 between the resistance region 47 and the diffusion region 48 with the reference value, to decide that surge breakdown resistance is excellent if the plane distance D3 exceeds the reference value, while deciding a surge breakdown resistance error if the former is below the latter.

After termination of the step S7 shown in FIG. 2, the verification result output module 6 outputs the verification result display data 56 to the display module 7 on the basis of the verification result information obtained at the steps S5 to S7 respectively, to display the data 56 on the display module 7 at a step S9. If the process is advanced to the step S8 from the step S4 through branch processing with no input resistance, however, a surge breakdown resistance error is decided at the step S8 and hence the verification result output module 6 regards the surge breakdown resistance error obtained from the input resistance verification module 3 as verification result information and outputs the verification result display data 56 to the display module 7.

Thus, the layout pattern verification apparatus according to the first embodiment obtains the layout information provided with input circuit information from the layout pattern data to automatically verify surge breakdown resistance with respect to an input resistance in various ways from the layout information provided with input circuit information through the input resistance verification rule.

Figure 9:
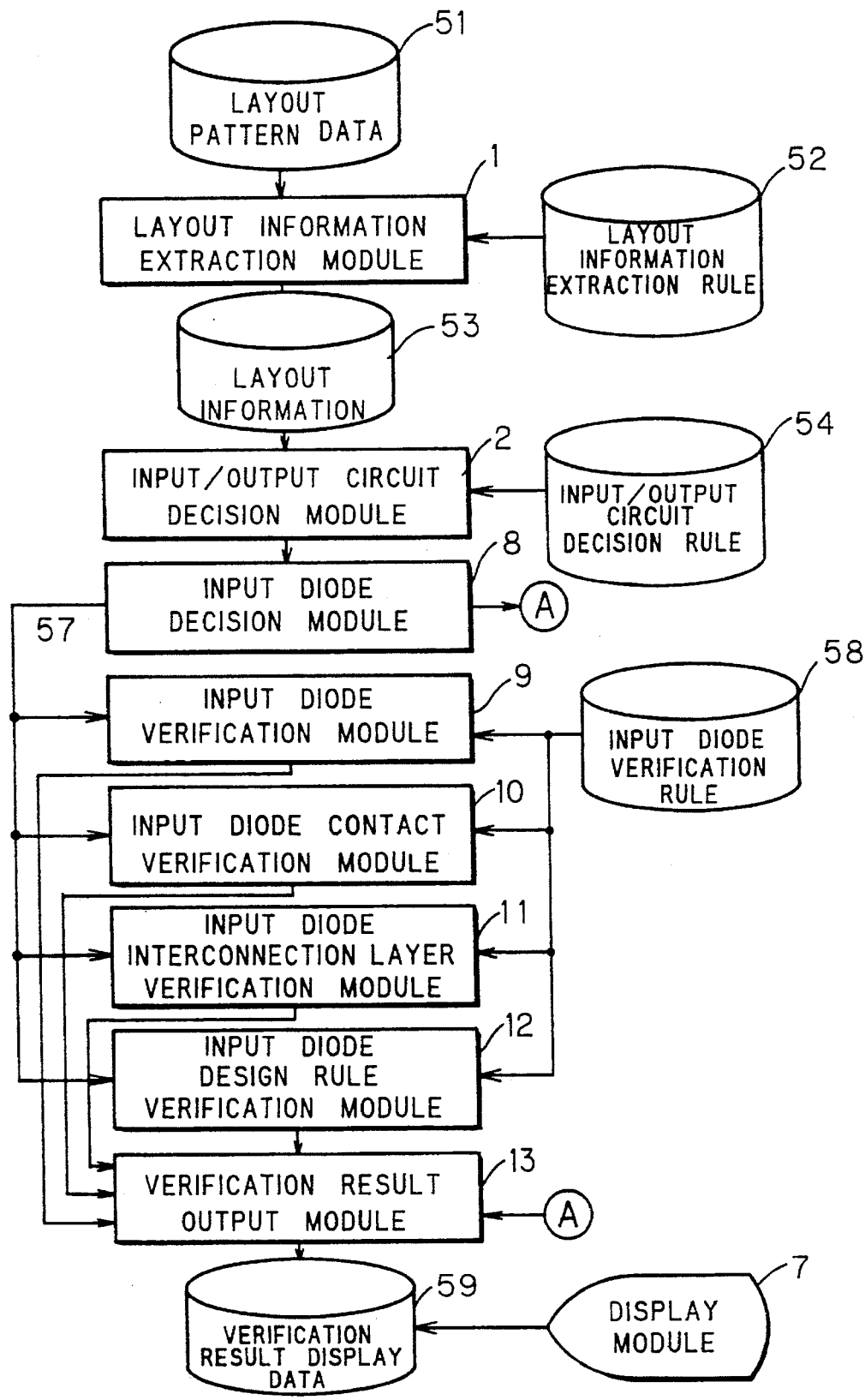
FIG. 9 is a block diagram showing the structure of a layout pattern verification apparatus according to a second embodiment of the present invention.

FIG. 9 is a block diagram showing the structure of a layout pattern verification apparatus according to a second embodiment of the present invention. As shown in FIG. 8, a layout information extraction module 1 incorporates layout pattern data 51 and layout information extraction rule 52, and outputs layout information 53 to an input/output circuit decision module 2, similarly to the first embodiment.

The input/output circuit decision module 2 incorporates the layout information 53 and the input/output circuit decision rule 54, and outputs layout information 57 provided with input/output circuit information obtained by adding input/output circuit information to the layout information 53 on the basis of an input/output circuit decision rule 54.

An input diode decision module 8 incorporates the layout information 57 provided with input/output information and verifies presence/absence of an input diode in a layout pattern of an input/output circuit part defined by the layout information 57 provided with input/output information, to directly output the layout information 57 provided with input/output information to an input diode verification module 9, an input diode contact verification module 10, an input diode interconnection layer verification module 11 and an input diode design rule verification module 12 upon presence of an input diode. Upon absence of an input diode, on the other hand, it outputs a surge breakdown resistance error to a verification result output module 13 as verification result information.

The input diode verification module 9 incorporates the layout information 57 provided with input/output information and the input diode verification rule 58, verifies the shape, area etc. of the input diode in the input/output circuit part defined by the layout information 57 provided with input/output information thereby verifying surge breakdown resistance on the input diode itself, and outputs verification result information to the verification result output module 13. The input diode verification rule 58 is provided by input diode verification rule providing means (not shown).

The input diode contact verification module 10 incorporates the layout information 57 provided with input/output information and the input diode verification rule 58, verifies the shape, area etc. of a contact part of the input diode in the layout pattern of the input/output circuit part defined by the layout information 57 provided with input/output information thereby verifying surge breakdown resistance on the input diode contact region, and outputs verification result information to the verification result output module 13.

The input diode interconnection layer verification module 11 incorporates the layout information 57 provided with input/output information and the input diode verification rule 58, verifies whether or not all power supply wires and ground wires connected to the input diode in the layout pattern of the input/output circuit part defined by the layout information 57 provided with input/output information are formed in a layer defined by the input diode verification rule 58 thereby verifying surge breakdown resistance on the input diode interconnection layer, and outputs verification result information to the verification result output module 13.

The input diode design rule verification module 12 incorporates the layout information 57 provided with input/output information and the input diode verification rule 58, verifies geometrical positional relation between the input diode in the layout pattern of the input/output circuit part defined by the input diode verification rule 58 and its peripheral region thereby verifying surge breakdown resistance on the input diode and its peripheral region, and outputs verification result information to the verification result output module 13.

The verification result output module 13 outputs verification result display data 59 for verifying surge breakdown resistance to a display module 7 such as a display unit on the basis of the verification result information obtained from the input diode verification module 9, the input diode contact verification module 10, the input diode interconnection layer verification module 11 and the input diode design rule verification module 12 respectively, thereby graphically displaying verification result information on the display module 7.

Figure 10:
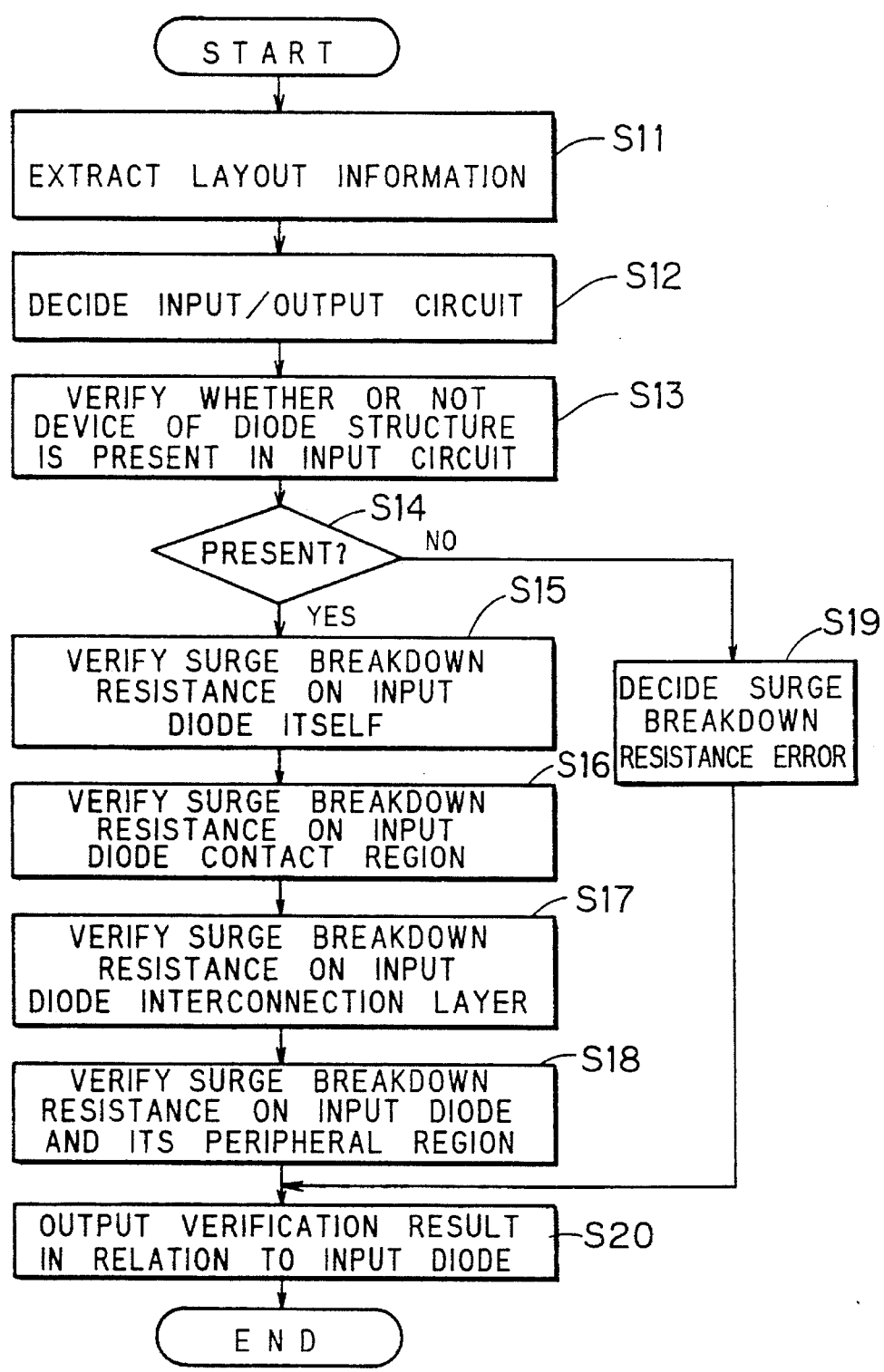
FIG. 10 is a flow chart showing a surge breakdown resistance verification operation of the layout pattern verification apparatus according to the second embodiment.

FIG. 10 is a flow chart showing the verification operation of the layout pattern verification apparatus according to the second embodiment.

Referring to FIG. 10, the layout information extraction module 1 incorporates the layout pattern data 51 and the layout information extraction rule 52 and outputs the layout information 53 obtained by adding device information, circuit connection information and the like to the layout pattern data 51 on the basis of the layout information extraction rule 52 to the input/output circuit decision module 2 at a step S11.

At a step S12, the input/output circuit decision module 2 incorporates the layout information 53 and the input/output circuit decision rule 54 and identifies the input/output circuit part in the layout pattern defined by the layout information 53 on the basis of the input/output circuit decision rule 54, and outputs the layout information 57 provided with input/output information to the input diode decision module 8, similarly to the first embodiment.

At a step S13, the input diode decision module 8 verifies presence/absence of an input diode in the layout pattern of the input/output circuit part defined by the layout information 57 provided with input/output information, so that a step S14 branches to a step S15 upon presence of an input diode, or to a step S19 upon absence of an input diode.

Figure 11:
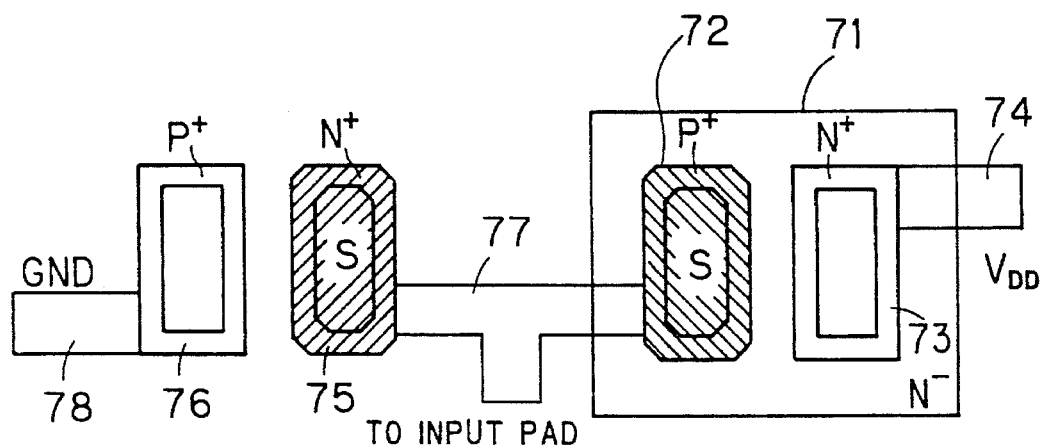
FIG. 11 is a plan view for illustrating an input diode decision module in the layout pattern verification apparatus according to the second embodiment.
Figure 12:
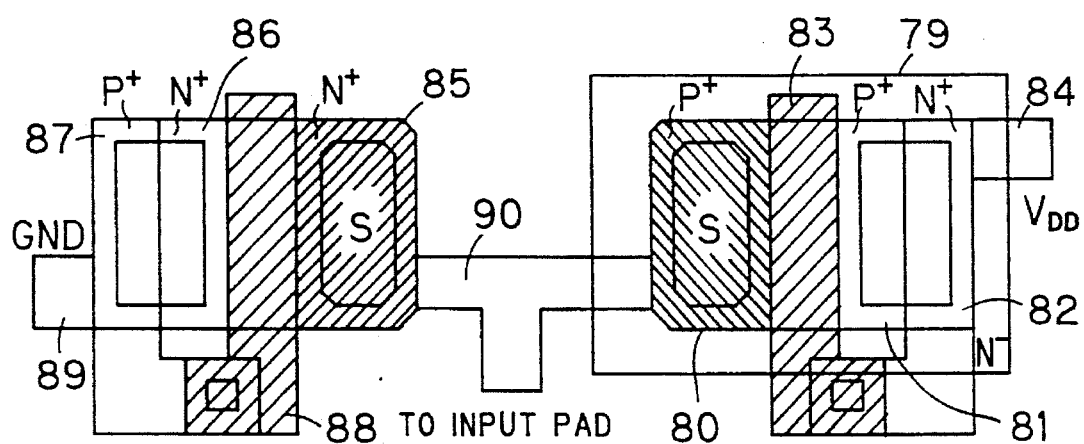
FIG. 12 is a plan view for illustrating the operation of the input diode decision module in the layout pattern verification apparatus according to the second embodiment.

FIGS. 11 and 12 are plan views showing examples of input diodes decided by the input diode decision module 8. As shown in FIG. 11, an N$^-$-type well region 71 is formed on a P-type substrate (not shown), while a P$^+$-type diffusion region 72 and an N$^+$-type diffusion region 73 are formed in the N$^-$-type well 71 so that the N$^+$-type diffusion region 73 is connected to a power supply VDD through an interconnection layer 74. Further, an N$^+$-type diffusion region 75 and a P$^+$-type diffusion region 76 are formed on the P-type substrate, so that the P$^+$-type diffusion region 72 is connected to the N$^+$-type diffusion region 75 through an interconnection layer 77 and to an external input pad (not shown). The P$^+$-type diffusion region 76 is grounded through an interconnection layer 78.

Referring to FIG. 12, an N$^-$-type well region 79 is formed on a P-type substrate (not shown), while P$^+$-type diffusion regions 80 and 81 and an N$^+$-type diffusion region 82 are formed on the surface of the N$^-$-type well region 79 and a polysilicon layer 83 is formed between the P$^+$-type diffusion regions 80 and 81 through an insulating film (not shown). The N$^+$-type diffusion region 82 is shorted with the P$^+$-type diffusion region 81, connected with the polysilicon layer 83, and connected with the power supply VDD through the interconnection layer 84. On the other hand, N$^+$-type diffusion regions 85 and 86 and a P$^+$-type diffusion region 87 are formed on the P-type substrate, and a polysilicon layer 88 is formed between the N$^+$-type diffusion regions 85 and 86 through an insulating film (not shown). The P$^+$-type diffusion region 87 is shorted with the N$^+$-type diffusion region 86, connected with the polysilicon layer 88, and grounded through an interconnection layer 89. The N$^+$-type diffusion region 85 is connected to the P$^+$-type diffusion region 80 and an external input pad (not shown) through the interconnection layer 90.

Figure 13:
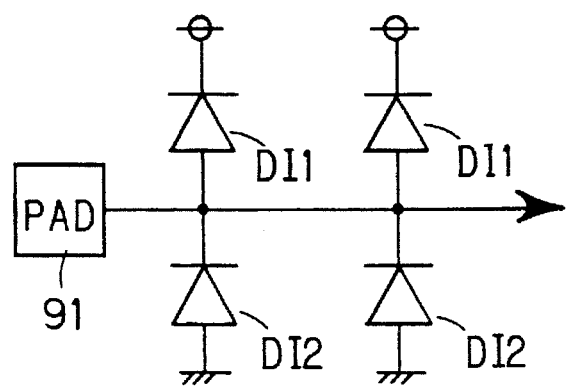
FIG. 13 is an equivalent circuit diagram for illustrating the operation of the input diode decision module in the layout pattern verification apparatus according to the second embodiment.
Figure 14:
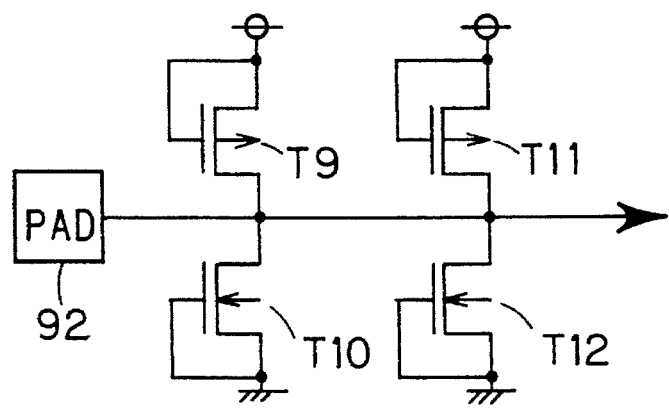
FIG. 14 is an equivalent circuit diagram for illustrating the operation of the input diode decision module in the layout pattern verification apparatus according to the second embodiment.

FIGS. 13 and 14 are equivalent circuit diagrams of the input diodes shown in FIGS. 11 and 12 respectively. A diode DI1 shown in FIG. 13 corresponds to that formed on the N$^-$-type well region 71 shown in FIG. 11, while a diode DI2 shown in FIG. 13 corresponds to that formed by the N$^+$-type diffusion region 75, the P$^+$-type diffusion region 76 etc. of FIG. 11 respectively. Numeral 91 denotes an input pad.

On the other hand, a PMOS transistor T9 (T11) shown in FIG. 14 corresponds to that formed on the N$^-$-type well region 79 in FIG. 12, while an NMOS transistor T10 shown in FIG. 14 corresponds to that formed by the N$^+$-type diffusion regions 85 and 86, the polysilicon layer 86 etc. of FIG. 12. Numeral 92 denotes an input pad.

The input diode decision module 8 decides not only the ordinary diodes DI1 and DI2 shown in FIGS. 11 and 13, which are connected to the input pads, but drain regions of the PMOS transistor T9 and T11, whose gates and sources are connected to the power supply VDD, and drain regions of the NMOS transistors T10 and T12, whose gates and sources are grounded, as shown in FIGS. 12 and 14, as diodes.

When presence of the input diodes is recognized at the step S14 shown in FIG. 10, the input diode verification module 9 verifies the shapes, areas etc. of the input diodes for verifying surge breakdown resistance on the input diodes themselves, and outputs verification result information to the verification result output module 13 at a step S15.

As to shape verification of the input diodes, the module 9 verifies a formation angle at each corner portion of each diffusion region forming each diode to decide that field concentration is hardly caused in the corner portion and there is a little possibility of surge breakdown if the formation angle exceeds 90°, while deciding that there is a possibility of surge breakdown caused by field concentration in the corner portion if the formation angle is not more than 90°. As to area verification of the input diodes, on the other hand, the module 9 compares areas of the diffusion regions forming the input diodes and the total sum with reference values obtained from the input diode verification rule 58.

At a step S16, the input diode contact verification module 10 incorporates the layout information 57 provided with input/output information and the input diode verification rule 58, verifies surge breakdown resistance on contact regions of the input diodes in the layout pattern of the input/output circuit part defined by the layout pattern 57 provided with input/output information, and outputs verification result information to the verification result output module 13. This surge breakdown resistance verification operation is now described in detail.

Figure 15:
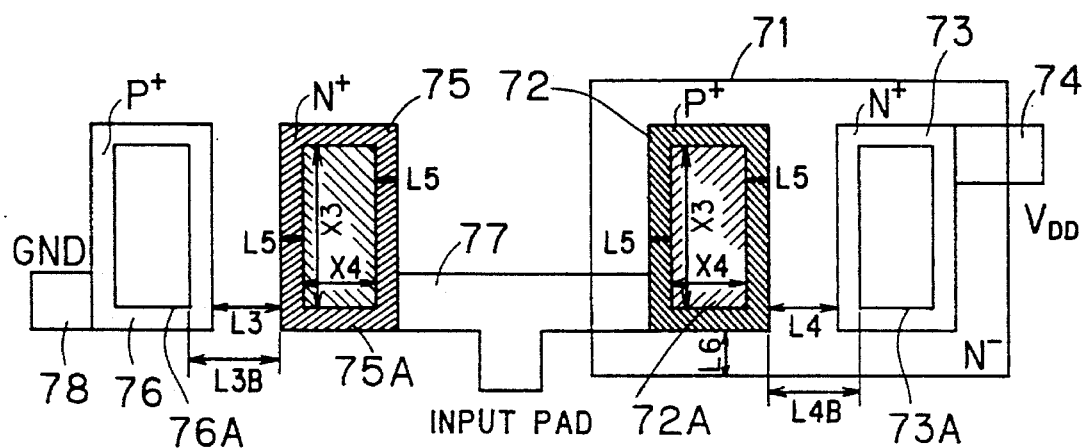
FIG. 15 is a plan view for illustrating the operation of an input diode contact verification module in the layout pattern verification apparatus according to the second embodiment.
Figure 16:
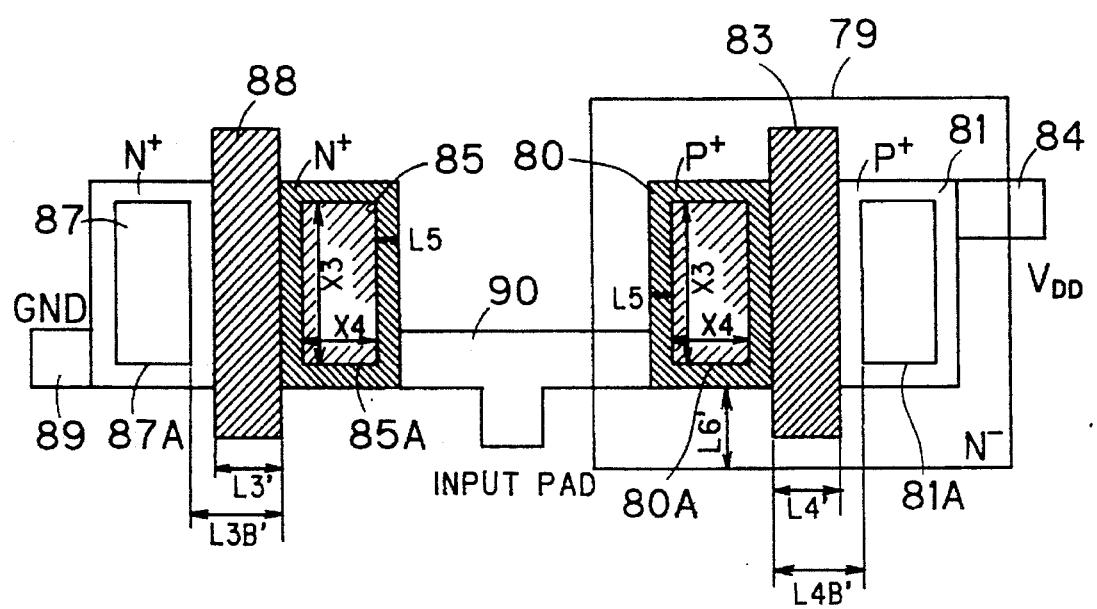
FIG. 16 is a plan view for illustrating the operation of the input diode contact verification module in the layout pattern verification apparatus according to the second embodiment.

FIGS. 15 and 16 are plan views for illustrating the input diode contact verification operation. Referring to FIG. 15, numeral 72A denotes a contact region of a P$^+$-type diffusion region 72, and numeral 75A denotes a contact region of an n$^+$-type diffusion region 75. Other structure of this figure is similar to that shown in FIG. 11, and hence redundant description is omitted. Referring to FIG. 16, on the other hand, numeral 80A denotes a contact region of a P$^+$-type diffusion region 80, and numeral 85A denotes a contact region of an N$^+$-type diffusion region 85. Other structure of this figure is similar to that shown in FIG. 12, and hence redundant description is omitted.

Referring to FIGS. 15 and 16, symbols X3 and X4 denote formation widths of the contact regions 72A, 75A, 80A and 85A, and symbol L5 denotes contact margin distances.

The input diode contact verification module 10 verifies surge breakdown resistance depending on whether or not the formation angle of each contact region of each input diode is not more than 90°, similarly to the verification of each corner portion of each input diode.

The input diode contact verification module 10 detects widths (corresponding to X3 and X4 in FIG. 15) of the contact region of each input diode from the layout information 57 provided with input/output information and compares the detected widths with reference values obtained from the input diode verification rule 58, to verify surge breakdown resistance. The input diode contact verification module 10 further detects the contact margin distance (corresponding to L5 in FIG. 15) from the layout information 57 provided with input/output information and compares the detected widths and margin distance with reference values obtained from the input diode verification rule 58, to verify surge breakdown resistance. The input diode contact verification module 10 calculates the formation area of each contact region and compares the calculated area with a reference value obtained from the input diode verification rule 58, to verify surge breakdown resistance.

After termination of the step S16 shown in FIG. 10, the input diode interconnection layer verification module 11 incorporates the layout information 57 provided with input/output information and the input diode verification rule 58 at a step S17, verifies whether or not all power supply wires and ground wires connected to the input diodes in the layout pattern of the input/output circuit defined by the layout information 57 provided with input/output information are formed in formation layers defined by the input diode verification rule 58 thereby verifying surge breakdown resistance on the input diode interconnection layers, and outputs verification result information to the verification result output module 13.

At a step S18, the input diode design rule verification module 12 incorporates the layout information 57 provided with input/output information and the diode verification rule 58 and geometrically verifies widths, spaces etc. of each input diode in the layout pattern of the input/output circuit part defined by the layout information 57 provided with input/output information and its peripheral region thereby verifying surge breakdown resistance, and outputs verification result information to the verification result output module 13. This surge breakdown resistance verification operation is now described in detail with reference to FIGS. 15 and 16.

Referring to FIG. 15, a distance L4 between the P$^+$-type diffusion region 72 and the N$^+$-type diffusion region 73 which is connected to the power supply VDD, a distance L4B between the P$^+$-type diffusion region 72 and the contact region 73A of the N$^+$-type diffusion region 73 and a margin distance L6 between the P$^+$-type diffusion region 72 and the N$^-$-type well region 71 are verified in relation to the P$^+$-type diffusion region 72 forming a diode. In relation to the N$^+$-type diffusion region 75 forming a diode, on the other hand, a distance L3 between the N$^+$-type diffusion region 75 and the grounded P$^+$-type diffusion region 76 and a distance L3B between the N$^+$-type diffusion region 75 and the contact region 76A of the P$^+$-type diffusion region 76 are verified. When such verified distances are below reference values obtained from the input diode verification rule 58 respectively, the input diode design rule verification module 12 decides surge breakdown resistance errors.

Referring to FIG. 16, on the other hand, a distance L4' between the P$^+$-type diffusion region 80 and the P$^+$-type diffusion region 81 which is connected to the power supply VDD, a distance L4B' between the P$^+$-type diffusion region 80 and the P$^+$-type diffusion region 81 and a margin distance L6' between the P$^+$-type diffusion region 80 and the N$^-$-type well region 79 are verified in relation to the P$^+$-type diffusion region 80 regarded as a diode. In relation to the N$^+$-type diffusion region 85 regarded as a diode, on the other hand, a distance L3' between the N$^+$-type diffusion region 85 and the grounded N$^+$-type diffusion region 87 and a distance L3B' between the N$^+$-type diffusion region 85 and the contact region 87A of the N$^+$-type diffusion region 87 are verified. When such verified distances are below reference values obtained from the input diode verification rule 58 respectively, the input diode design rule verification module 12 decides surge breakdown resistance errors.

After termination of the step S18 in FIG. 10, the verification result output module 13 outputs the verification result display data 59 to the display module 7 on the basis of the verification result information obtained at the steps S15 to S18 respectively, to display the verification result display data 59 on the display module 7 at a step S20. If the process is advanced from the step S14 to the step S19 through branch processing with no input diode, surge breakdown resistance errors are decided at the step S19 and hence the verification result output module 13 regards the surge breakdown resistance errors obtained from the input diode decision module 8 as verification result information and outputs the verification result display data 59 to the display module 7.

Thus, the layout pattern verification apparatus according to the second embodiment obtains the layout information provided with input circuit information from the layout pattern data, to automatically verify surge breakdown resistance on the input diodes from the layout information provided with input circuit information through the input diode verification rule in various ways.

Figure 17:
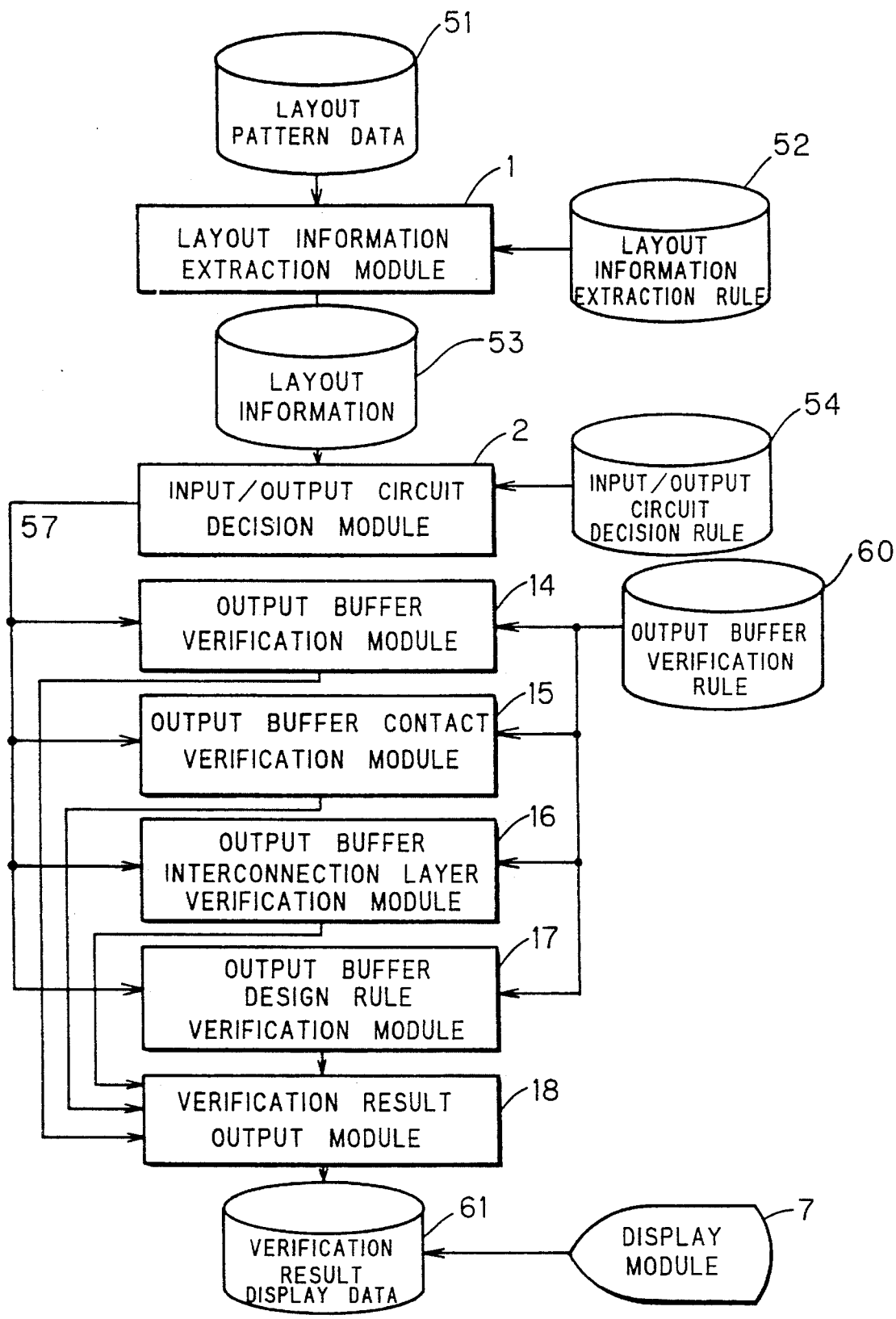
FIG. 17 is a block diagram showing the structure of a layout pattern verification apparatus according to a third embodiment of the present invention.

FIG. 17 is a block diagram showing the structure of a layout pattern verification apparatus according to a third embodiment of the present invention. As shown in FIG. 17, a layout information extraction module 1 incorporates layout pattern data 51 and a layout information extraction rule 52 and outputs layout information 53 to an input/output circuit decision module 2, similarly to the first embodiment.

The input/output circuit decision module 2 incorporates the layout information 53 and the input/output circuit decision rule 54, and outputs layout information 57 provided with input/output circuit information obtained by adding input/output circuit information to the layout information 53 on the basis of an input/output circuit decision rule 54 to an output buffer verification module 14, an output buffer contact verification module 15, an output buffer interconnection layer verification module 16 and an output buffer design rule verification module 17.

The output buffer verification module 14 incorporates the layout information 57 provided with input/output information and an output buffer verification rule 60, verifies shapes, areas etc. of output buffers in an input/output circuit part defined by the layout information 57 provided with input/output information thereby verifying surge breakdown resistance on the output buffers themselves, and outputs verification result information to the verification result output module 18. The output buffer verification rule 60 is provided by output buffer verification means (not shown).

The output buffer contact verification module 15 incorporates the layout information 57 provided with input/output information and the output buffer verification rule 60, verifies shapes, areas etc. of contact regions of the output buffers in the layout pattern of the input/output circuit part defined by the layout information 57 provided with input/output information thereby verifying surge breakdown resistance on the output buffer contact regions, and outputs verification result information to the verification result output module 18.

The output buffer interconnection layer verification module 16 incorporates the layout information 57 provided with input/output information and the output buffer verification rule 60, verifies whether or not all power supply wires and ground wires connected to the output buffers in the layout pattern of the input/output circuit part defined by the layout information 57 provided with input/output information are formed in formation layers defined by the output buffer verification rule 60 thereby verifying surge breakdown resistance on the output buffer interconnection layers, and outputs verification result information to the verification result output module 18.

The output buffer design rule verification module 17 incorporates the layout information 57 provided with input/output information and the output buffer verification rule 60, geometrically verifies output buffers in the layout pattern of the input/output circuit part defined by the output buffer verification rule 60 and peripheral regions thereof thereby verifying surge breakdown resistance on the output buffer peripheral regions, and outputs verification result information to the verification result output module 18.

The verification result output module 18 outputs verification result display data 59 for surge breakdown resistance verification to a display module 7 such as a display unit on the basis of the verification result information obtained from the output buffer verification module 14, the output buffer contact verification module 15, the output buffer interconnection layer verification module 16 and the output buffer design rule verification module 17 respectively, thereby graphically displaying the verification result information on the display module 7.

Figure 18:
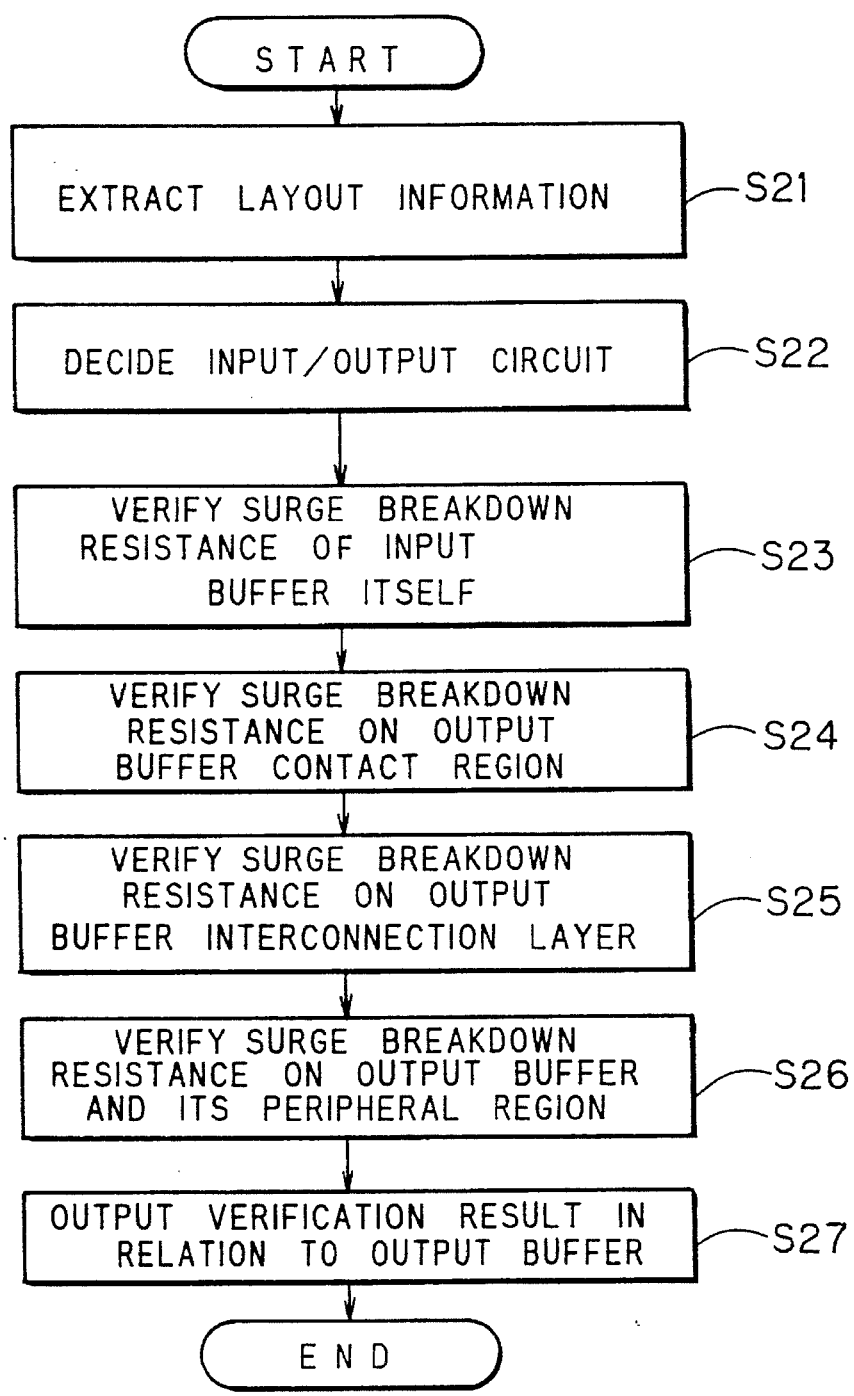
FIG. 18 is a flow chart showing a surge breakdown resistance verification operation of the layout pattern verification apparatus according to the third embodiment.

FIG. 18 is a flow chart showing the verification operation of the layout pattern verification apparatus according to the third embodiment.

Referring to FIG. 18, the layout information extraction module 1 incorporates the layout pattern data 51 and the layout information extraction rule 52 and outputs the layout information 53 obtained by adding device information, circuit connection information etc. to the layout pattern data 51 to the input/output circuit decision module 2 at a step S21.

At a step S22, the input/output circuit decision module 2 incorporates the layout information 53 and the input/output circuit decision rule 54, identifies an input/output circuit part in a layout pattern defined by the layout information 53 on the basis of the input/output circuit decision rule 54, and outputs the layout information 57 provided with input/output information to the output buffer verification module 14, similarly to the first embodiment.

At a step S23, the output buffer verification module 14 verifies shapes, areas etc. of output buffers for verifying surge breakdown resistance on the output buffers themselves, and outputs verification result information to the verification result output module 18. This operation is now described in detail with reference to FIGS. 19 and 20.

Figure 19:
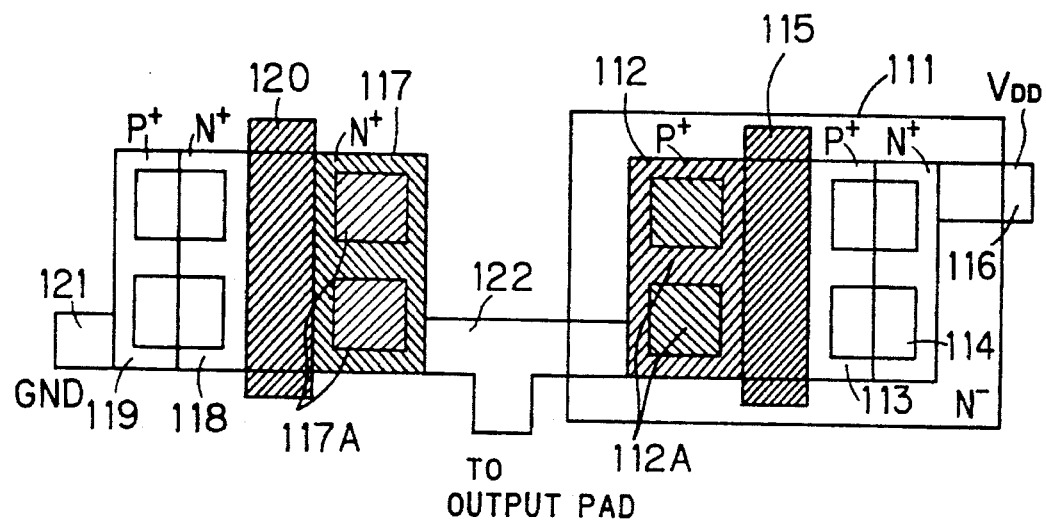
FIG. 19 is a plan view for illustrating the operation of an output buffer verification module in the layout pattern verification apparatus according to the third embodiment.
Figure 20:
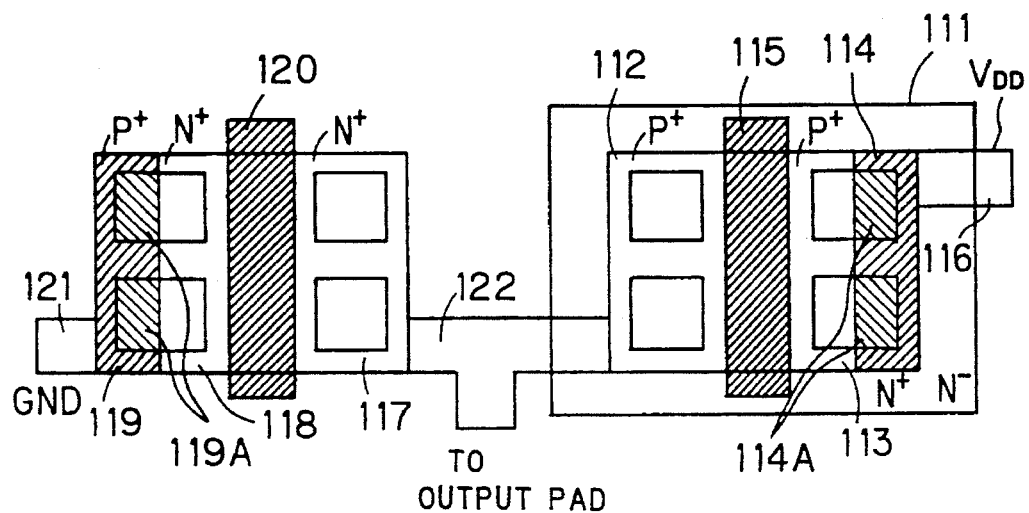
FIG. 20 is a plan view for illustrating the operation of the output buffer verification module in the layout pattern verification apparatus according to the third embodiment.

Referring to each of FIGS. 19 and 20, an $N^-$-type well region 111 is formed on a P-type substrate (not shown), while $P^+$-type diffusion regions 112 and 113 and an $N^+$-type diffusion region 114 are formed on the $N^-$-type well region 111 and a polysilicon layer 115 is formed between the $P^+$-type diffusion regions 112 and 113 through a gate oxide film (not shown). The $P^+$-type diffusion region 113 and the $N^+$-type diffusion region 114 are shorted, and the $N^+$-type diffusion region 114 is connected to a power supply VDD through an interconnection layer 116. On the other hand, $N^+$-type diffusion regions 117 and 118 and a $P^+$-type diffusion region 119 are formed on the P-type substrate, and a polysilicon layer 120 is formed between the $N^+$-type diffusion regions 117 and 118 through a gate insulating film (not shown). The $N^+$-type diffusion region 118 and the $P^+$-type diffusion region 119 are shorted, and the $P^+$-type diffusion region 119 is grounded through an interconnection layer 121. The $N^+$-type diffusion region 117 and the $P^+$-type diffusion region 112 are grounded through an interconnection layer 122. This interconnection layer 122 is also connected to an output pad (not shown).

In such a structure, output of a CMOS inverter which is defined by a PMOS transistor formed by the $P^+$-type diffusion regions 112 and 113, the polysilicon layer 115 and the like and an NMOS transistor formed by the $N^+$-type diffusion regions 117 and 118, the polysilicon layer 120 and the like is connected to the output pad, whereby this structure is recognized as an output buffer.

The output buffer verification module 14 recognizes diffusion regions (corresponding to the $P^+$-type diffusion region 112 and the $N^+$-type diffusion region 117 in FIG. 19) in the output buffer connected to the output pad and diffusion regions (corresponding to the $N^+$-type diffusion region 111 and the $P^+$-type diffusion region 119 in FIG. 20) connected to the power supply VDD and the ground level as output buffer diffusion regions.

The module 14 verifies a formation angle in each corner portion of each output buffer diffusion region to decide that field concentration is hardly caused in the corner portion and there is a little possibility of surge breakdown if the formation angle exceeds 90°, while deciding that field concentration is caused in the corner portion to lead to surge breakdown if the formation angle is not more than 90°.

Further, the output buffer verification module 14 verifies surge breakdown resistance also by comparing respective areas of the output buffer diffusion regions and the total sum thereof with reference values obtained from the output buffer verification rule 60.

After termination of the step S23 shown in FIG. 18, the output buffer contact verification module 15 incorporates the layout information 57 provided with input/output information and the output buffer verification rule 60, verifies surge breakdown resistance on the output buffer contact regions in the layout pattern of the input/output circuit part defined by the layout pattern information 57 provided with input/output information, and outputs verification result information to the verification result output module 18 at a step S24. This surge breakdown resistance verification operation is now described in detail.

Figure 21:
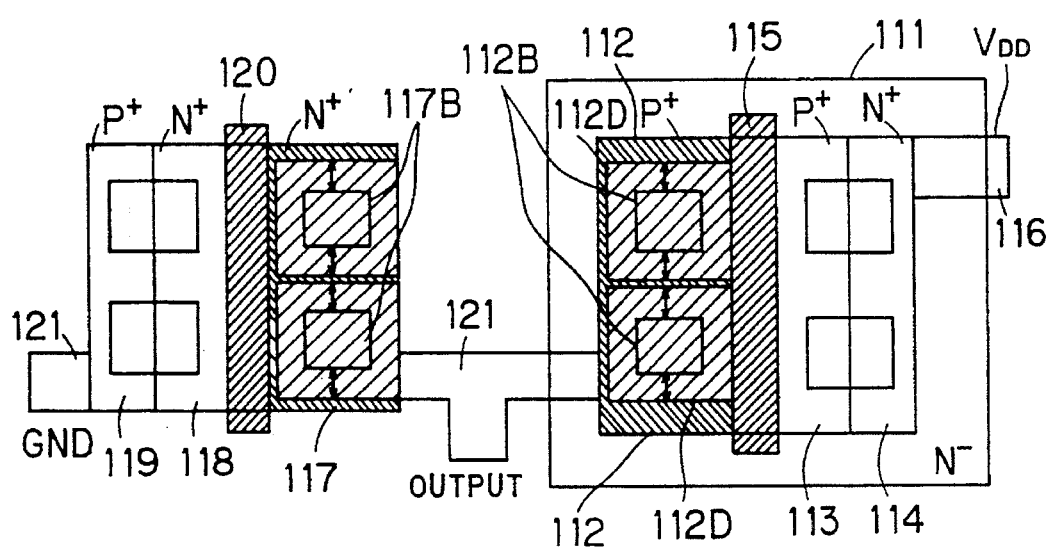
FIG. 21 is a plan view for illustrating the operation of an output buffer contact verification module in the layout pattern verification apparatus according to the third embodiment.

FIG. 21 is a plan view for illustrating the surge breakdown resistance verification operation for an output buffer contact region. Referring to FIG. 21, numerals 112B and 117B denote contact regions of a $P^+$-type diffusion region 112 and an $N^+$-type diffusion region 117 respectively, and numerals 112D and 117D denote contact oversize regions obtained by oversizing the contact regions 112B and 117B by reference widths obtained from the output buffer verification rule 60. Other structure of this figure is similar to that shown in FIG. 19 or 20, and hence redundant description is omitted.

The output buffer contact verification module 15 verifies surge breakdown resistance depending on whether or not the formation angle of each corner portion of each contact region of each output buffer diffusion region is not more than 90°, similarly to that on each output buffer diffusion region.

The output buffer contact verification module 15 verifies whether or not each contact oversize region in each output buffer diffusion region can entirely cover the output buffer diffusion region. Referring to FIG. 21, the oversize regions 112D and 117D cannot cover the $P^+$-type diffusion region 112 and the $N^+$-type diffusion region 117 respectively, and hence the module 15 decides surge breakdown resistance errors.

Figure 22:
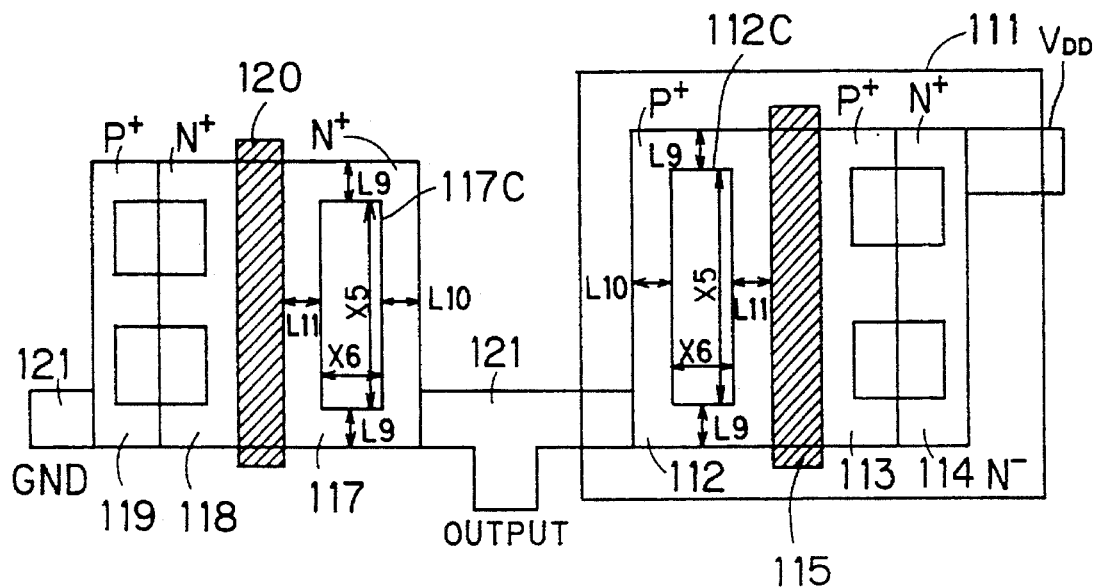
FIG. 22 is a plan view for illustrating the operation of an output buffer design rule verification module in the layout pattern verification apparatus according to the third embodiment.

The output buffer contact verification module 15 also verifies widths X5 and X6 of contact regions 112C and 117C of a $P^+$-type diffusion region 112 and an $N^+$-type diffusion region 117 and contact margin distances L9 to L11 shown in FIG. 22 and compares the verified distances with reference values obtained from the output buffer verification rules 60 respectively, thereby verifying surge breakdown resistance.

After termination of the step S24 in FIG. 18, the output buffer interconnection layer verification module 16 incorporates the layout information 57 provided with input/output information and the output buffer verification rule 60, verifies whether or not all power supply wires and ground wires connected to the output buffers in the layout pattern of the input/output circuit part defined by the layout information 57 provided with input/output information are formed in formation layers defined by the output buffer verification rule 60 thereby verifying surge breakdown resistance of the output buffer interconnection layers, and outputs verification result information to the verification result output module 18 at a step S25.

At a step S26, the output buffer design rule verification module 17 incorporates the layout information 57 provided with input/output information and the output buffer verification rule 60, geometrically verifies the output buffers in the layout pattern of the input/output circuit part defined by the layout information 57 provided with input/output information and peripheral regions thereof thereby verifying surge breakdown resistance, and outputs verification result information to the verification result output module 18. This surge breakdown resistance verification operation is now described with reference to FIG. 23.

Figure 23:
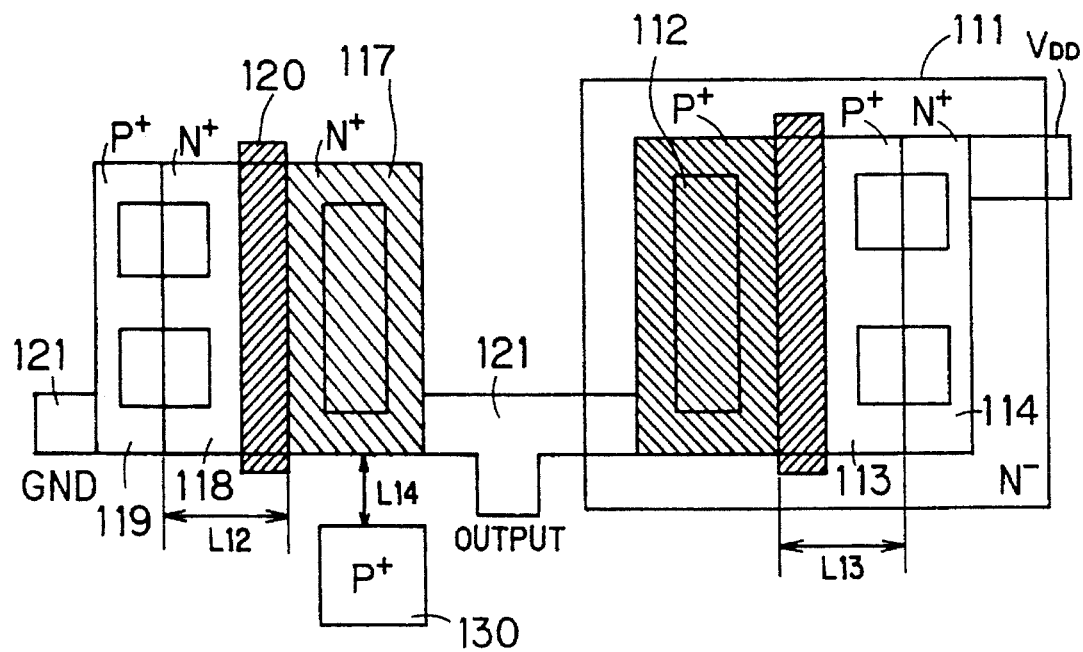
FIG. 23 is a plan view for illustrating the operation of the output buffer design rule verification module in the layout pattern verification apparatus according to the third embodiment.

Referring to FIG. 23, a distance L13 between a $N^+$-type diffusion region 112 and an $N^+$-type diffusion region 114 which is connected to a power supply VDD is verified in relation to the $P^+$-type diffusion region 112 which is an output buffer diffusion region. In relation to an $N^+$-type diffusion region 117 which is another output buffer diffusion region, on the other hand, a distance L12 between the $N^+$-type diffusion region 117 and a grounded $P^+$-type diffusion region 119 is verified. If there is a $P^+$-type diffusion region 130, which is a diffusion region absolutely different from an output buffer, a distance L14 between the $N^+$-type diffusion region 117 and the $P^+$-type diffusion region 130 is also verified. If the verified distances are below reference values obtained from the input/output buffer verification rule 60 respectively, the output buffer design rule verification module 17 decides surge breakdown resistance errors.

After termination of the step S26 shown in FIG. 18, the verification result output module 18 outputs verification result display data 61 to the display module 7 on the basis of the verification result information obtained at the steps S23 to S26 respectively, to display the verification result display data 61 on the display module 7.

Thus, the layout pattern verification apparatus according to the third embodiment obtains the layout information provided with input circuit information from the layout pattern data to automatically verify surge breakdown resistance on the output buffers in various ways from the layout pattern information provided with input circuit information through the output buffer verification rule.

Figure 24:
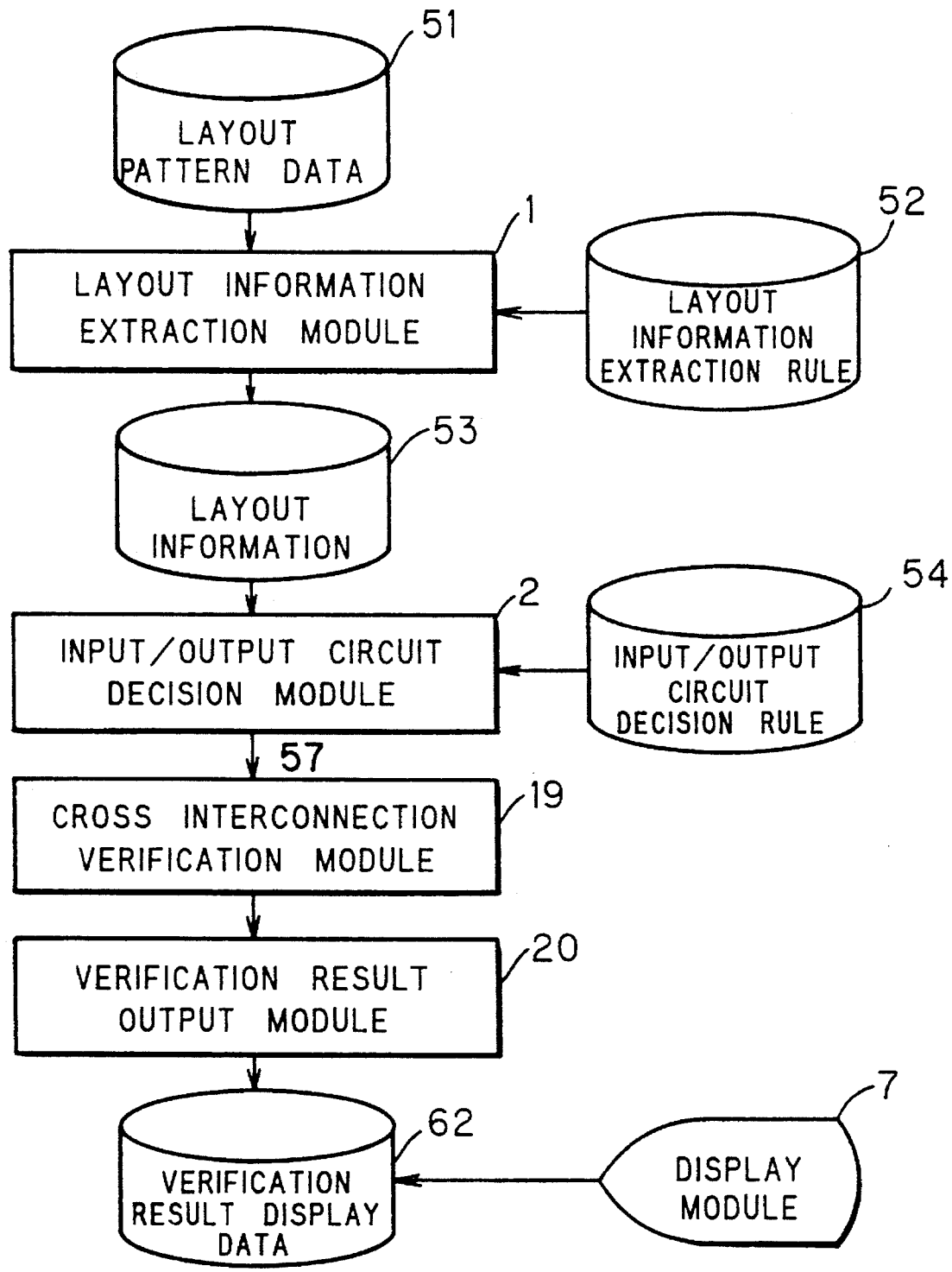
FIG. 24 is a block diagram showing the structure of a layout pattern verification apparatus according to a fourth embodiment of the present invention.

FIG. 24 is a block diagram showing the structure of a layout pattern verification apparatus according to a fourth embodiment of the present invention. As shown in FIG. 24, a layout information extraction module 1 incorporates layout pattern data 51 and a layout information extraction rule 52 and outputs layout information 53 to an input/output circuit decision module 2, similarly to the first embodiment.

The input/output circuit decision module 2 incorporates the layout information 53 and the input/output decision rule 54, and outputs layout information 57 provided with input/output circuit information obtained by adding input/output circuit information to the layout information 53 on the basis of the input/output circuit decision rule 54 to a cross interconnection verification module 19.

A verification result output module 20 outputs verification result display data 59 for surge breakdown resistance verification to a display module 7 such as a display unit on the basis of the verification result information obtained from the cross interconnection verification module 19, thereby graphically displaying the verification result information on the display module 7.

Figure 25:
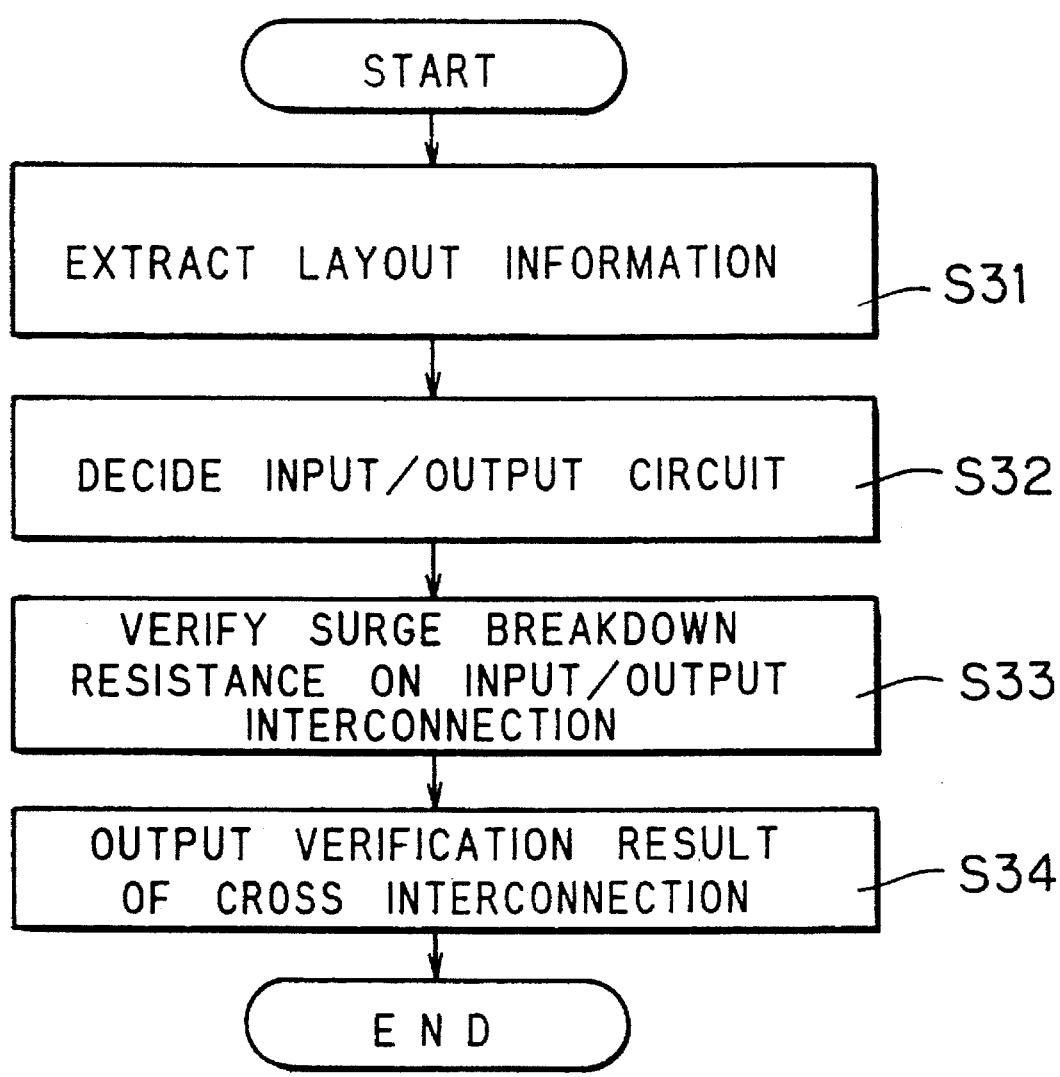
FIG. 25 is a flow chart showing a surge breakdown resistance verification operation of the layout pattern verification apparatus according to the fourth embodiment.

FIG. 25 is a flow chart showing a verification operation of the layout pattern verification apparatus according to the fourth embodiment.

Referring to FIG. 25, the layout information extraction module 1 incorporates the layout pattern data 51 and the layout information extraction rule 52 and outputs the layout information 53 obtained by adding device information, circuit connection information etc. to the layout pattern data 51 to the input/output circuit decision module 2 on the basis of the layout information extraction rule 52 at a step S31, similarly to the first embodiment.

At a step S32, the input/output circuit decision module 2 incorporates the layout information 53 and the input/output circuit decision rule 54, identifies an input/output circuit part in a layout pattern defined by the layout information 53 on the basis of the input/output circuit decision rule 54 and outputs layout information 57 provided with input/output information to the cross interconnection verification module 19, similarly to the first embodiment.

At a step S33, the cross interconnection verification module 19 verifies presence/absence of cross interconnection with respect to input/output interconnection thereby verifying surge breakdown resistance on the input/output interconnection, and outputs verification result information to the verification result output module 20. This operation is now described in detail with reference to an input circuit shown in FIG. 26 and an output circuit shown in FIG. 27.

Figure 26:
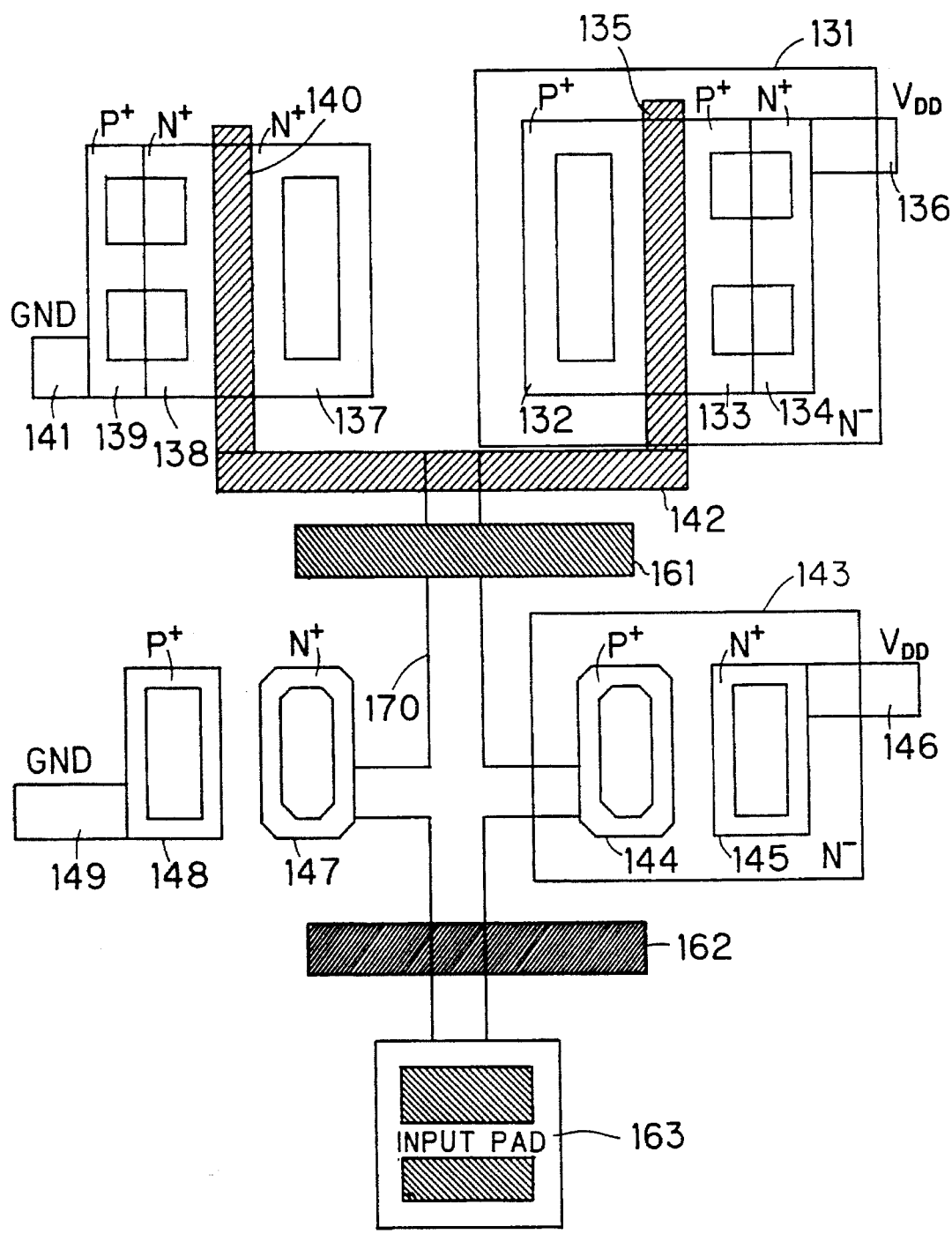
FIG. 26 is a plan view for illustrating the operation of a cross interconnection verification module in the layout pattern verification apparatus according to the fourth embodiment.

Referring to FIG. 26, an N⁻-type well region 131 is formed on a P-type substrate (not shown), while P⁺-type diffusion regions 132 and 133 and an N⁺-type diffusion region 134 are formed on the N⁻-type well region 131 and a polysilicon layer 135 is formed between the P⁺-type diffusion regions 132 and 133 through a gate oxide film (not shown). The P⁺-type diffusion region 133 and the N⁺-type diffusion region 134 are shorted, and the N⁺-type diffusion region 134 is connected to a power supply VDD through an interconnection layer 136. On the other hand, N⁺-type diffusion regions 137 and 138 and a P⁺-type diffusion region 139 are formed on the P-type substrate, while a polysilicon layer 140 is formed between the N⁺-type diffusion regions 137 and 138 through a gate insulating film (not shown). The N⁺-type diffusion region 138 and the P⁺-type diffusion region 139 are shorted, and the P⁺-type diffusion region 139 is grounded through an interconnection layer 141. The polysilicon layers 135 and 140 are connected to a polysilicon layer 142 in common. An interconnection layer 149 which is connected to the polysilicon layer 142 is connected to an input pad 163. Numeral 143 denotes an N⁻-type well region, numeral 144 denotes a P⁺-type diffusion region, numeral 145 denotes an N⁺-type type diffusion region, numeral 146 denotes an interconnection layer which is connected to the power supply VDD, numeral 147 denotes an N⁺-type diffusion region, numeral 148 denotes a P⁺-type diffusion region, and numeral 149 denotes an interconnection layer which is connected to the ground level. An interconnection layer 170 is connected to the polysilicon layer 142, the P⁺-type diffusion region 144 and the N⁺-type diffusion region 147, as well as to the input pad 163. Interconnection layers 161 and 162 are formed to intersect with this interconnection layer 170.

The cross interconnection verification module 19 recognizes the interconnection layer 170 which is connected to the input pad 163 as an input interconnection layer with respect to the input circuit shown in FIG. 26, and verifies presence/absence of cross interconnection with respect to this interconnection layer 170. In the example shown in FIG. 26, the module 19 decides a surge breakdown resistance error since the interconnection layers 161 and 162 intersect with the interconnection layer 170 on a plane.

Figure 27:
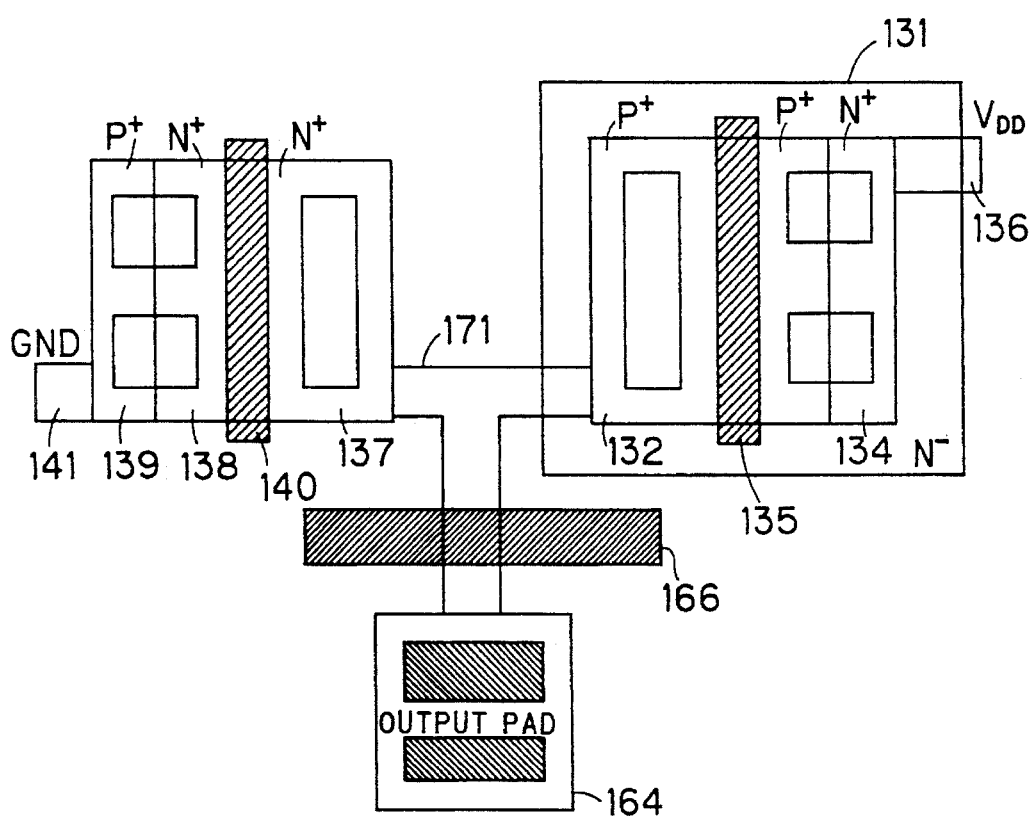
FIG. 27 is a plan view for illustrating the operation of the cross interconnection verification module in the layout pattern verification apparatus according to the fourth embodiment.
Figure 28:
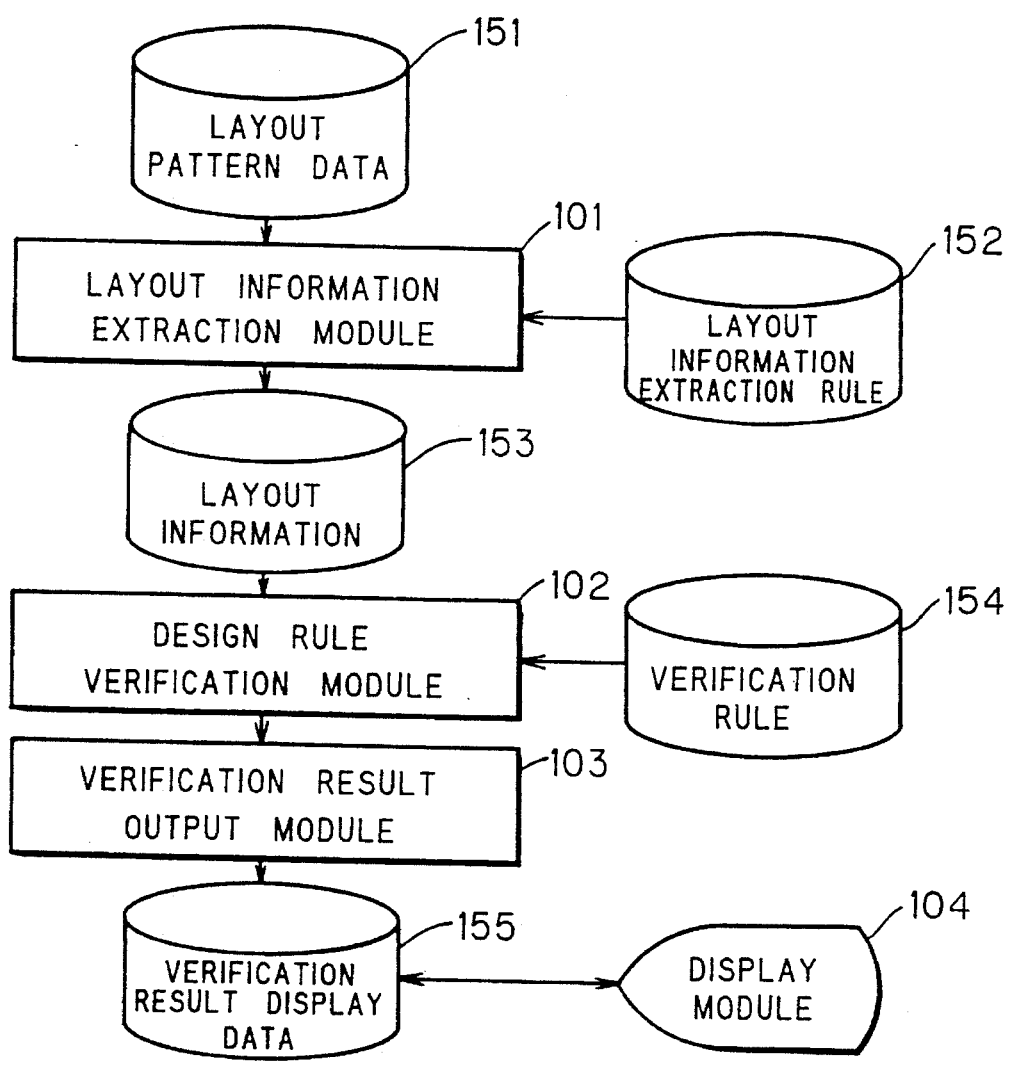
FIG. 28 is a block diagram showing the structure of a conventional layout pattern verification apparatus.
Figure 29:
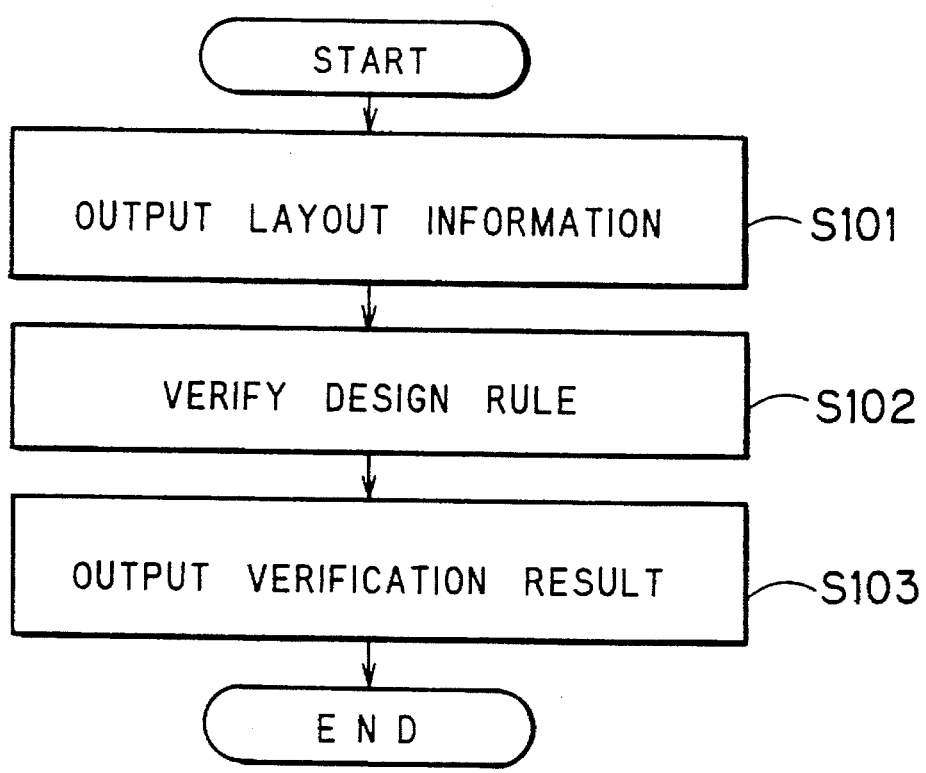
FIG. 29 is a flow chart showing a verification operation of the conventional layout pattern verification apparatus.

Referring to FIG. 27, on the other hand, an interconnection layer 171 which is connected to a P⁺-type diffusion region 132 and an N⁺-type diffusion region 137 is connected to an output pad 164. An interconnection layer 166 is formed to intersect with the interconnection layer 171. Other structure of this figure is similar to that shown in FIG. 26, and hence redundant description is omitted.

The cross interconnection verification module 19 recognizes the interconnection layer 171 which is connected to the output pad 164 as an output interconnection layer with respect to the output circuit shown in FIG. 27, and verifies presence/absence of cross interconnection with respect to the interconnection layer 171. In the example shown in FIG. 27, the module 19 decides a surge breakdown resistance error since the interconnection layer 166 intersects with the interconnection layer 171 on a plane.

After termination of the step S33 in FIG. 25, the verification result output module 20 outputs verification result display data 62 to the display module 7 on the basis of the verification result information obtained at the step S33 to display the verification result display data 62 on the display module 7 at a step S34.

Thus, the layout pattern verification apparatus according to the fourth embodiment obtains the layout information provided with input/output information from the layout pattern data and verifies presence/absence of cross interconnection planarly intersecting with input/output interconnection from the layout information provided with input circuit information, thereby automatically verifying surge breakdown resistance on the input/output interconnection.

While the input/output circuit information is added to the layout information 53 by the input/output circuit decision module 2 in each of the first to fourth embodiments, only the input circuit information may be sufficiently added in the first or second embodiment, and only the output circuit information may be sufficiently added in the third embodiment.

As to each of the first to fourth embodiments, further, the layout pattern verification apparatus may be formed by a combination of two or more layout pattern verification apparatuses.

While the invention has been shown and described in detail, the foregoing description is in all aspects illustrative and not restrictive. It is therefore understood that numerous modifications and variations can be devised without departing from the scope of the invention.

I claim:

1. A layout pattern verification apparatus comprising:

layout information providing means for providing layout information obtained by adding device information and circuit connection information to a layout pattern defining the structure of a semiconductor integrated circuit;

input circuit information addition means receiving said layout information and identifying an input circuit from said layout information for outputting layout information provided with input circuit information;

verification rule providing means for providing a surge breakdown resistance verification rule defining a geometric condition which needs to be satisfied on a layout pattern of an input resistance in said input circuit; and surge breakdown resistance verification means receiving said layout information provided with input circuit information and surge breakdown resistance verification rule for verifying surge breakdown resistance on said layout pattern of said input resistance in said input circuit defined by said layout information provided with input circuit information with reference to said surge breakdown resistance verification rule.

2. A layout pattern verification apparatus in accordance with claim 1, wherein said surge breakdown resistance verification rule includes a first rule related to the resistance value and the shape of a corner portion of said input resistance.

3. A layout pattern verification apparatus in accordance with claim 2, wherein said surge breakdown resistance verification rule includes a second rule related to a width and an area of a contact region provided in said input resistance and a margin distance between the same and said input resistance.

4. A layout pattern verification apparatus in accordance with claim 3, wherein said surge breakdown resistance verification rule includes a third rule related to a distance on a plane between said input resistance and a conductive region being provided on a different layer.

5. A layout pattern verification apparatus in accordance with claim 4, wherein said surge breakdown resistance verification means includes:

input resistance verification means for verifying surge breakdown resistance on said layout pattern of said input resistance itself being defined by said layout information provided with input circuit information with recreance to said first rule of said surge breakdown resistance verification rule, input resistance contact verification means for verifying surge breakdown resistance on a layout pattern related to said contact region of said input resistance being defined by said layout information provided with input circuit information with reference to said second rule of said surge breakdown resistance verification rule, and input resistance periphery verification means for verifying surge breakdown resistance on said layout pattern of said input resistance being defined by said layout information provided with input circuit information and its periphery with reference to said third rule of said surge breakdown resistance verification rule.

6. A layout pattern verification apparatus in accordance with claim 1, further comprising display means for displaying a surge breakdown resistance verification result on the basis of a result of verification by said surge breakdown resistance verification means.

7. A layout pattern verification apparatus in accordance with claim 1, wherein said input circuit information addition means extracts an external signal pad for identifying a circuit being formed by an element connected to a wire extending from said external signal pad toward a gate of a transistor as said input circuit when said pad is connected to said gate of said transistor.

8. A layout pattern verification apparatus comprising:

layout information providing means for providing layout information obtained by adding device information and circuit connection information to a layout pattern defining the structure of a semiconductor integrated circuit;

input circuit information addition means receiving said layout information and identifying an input circuit from said layout information for outputting layout information provided with input circuit information;

verification rule providing means for providing a surge breakdown resistance verification rule defining a geometric condition which needs to satisfied on a layout pattern of an input diode in said input circuit; and surge breakdown resistance verification means receiving said layout information provided with input circuit information and said surge breakdown verification rule for verifying surge breakdown resistance on a layout pattern of said input diode in said input circuit being defined by said layout information provided with input circuit information with reference to said surge breakdown resistance verification rule.

9. A layout pattern verification apparatus in accordance with claim 8, wherein said surge breakdown resistance verification rule includes a first rule related to an area and the shape of a corner portion of an input diode diffusion region being a diffusion region forming said input diode.

10. A layout pattern verification apparatus in accordance with claim 9, wherein said surge breakdown resistance verification rule includes a second rule related to a width and an area of a contact region provided in said input diode diffusion region and a margin distance between the same and said diffusion region.

11. A layout pattern verification apparatus in accordance with claim 10, wherein said surge breakdown resistance verification rule includes a third rule defining a layer to be provided with a power supply wire and a ground wire being connected to said input diode diffusion region.

12. A layout pattern verification apparatus in accordance with claim 11, wherein said surge breakdown resistance verification rule includes a fourth rule related to geometric positions of said input diode diffusion region and a peripheral region thereof.

13. A layout pattern verification apparatus in accordance with claim 12, wherein said surge breakdown resistance verification means recognizes a second electrode region of a P-channel transistor, having a control electrode and a first electrode connected to a power supply, and a second electrode region of an N-channel transistor, having a first electrode connected to a ground level, as diodes.

14. A layout pattern verification apparatus in accordance with claim 13, wherein said surge breakdown resistance verification means includes:

input diode verification means for verifying surge breakdown resistance on said layout pattern of said input diode diffusion region itself being defined by said layout information provided with input circuit information with reference to said first rule of said surge breakdown resistance verification rule, input diode contact verification means for verifying surge breakdown resistance on a layout pattern related to said contact region of said input diode diffusion region defined by said layout information provided with input circuit information with reference to said second rule of said surge breakdown resistance verification rule, input diode interconnection layer verification means for verifying surge breakdown resistance on a layout pattern related to said power supply wire and said ground wire connected to said input diode diffusion region defined by said layout information provided with input circuit information with reference to said third rule of said surge breakdown resistance verification rule, and input diode periphery verification means for verifying surge breakdown resistance on said layout pattern of said input diode diffusion region defined by said layout information provided with input information and its periphery with reference to said fourth rule of said surge breakdown resistance verification rule.

15. A layout pattern verification apparatus in accordance with claim 8, further comprising display means for displaying a surge breakdown resistance verification result on the basis of a result of verification by said surge breakdown 16. A layout pattern verification apparatus comprising:

layout information providing means for providing layout information obtained by adding device information and circuit connection information to layout pattern defining the structure of a semiconductor integrated circuit;

output circuit information addition means receiving said layout information and identifying an output circuit from said output information for outputting layout information provided with output circuit information;

verification rule providing means for providing a surge breakdown resistance verification rule defining a geometric condition which needs to be satisfied on a layout pattern of an output buffer in said output circuit; and surge breakdown resistance verification means receiving said layout information provided with output circuit information and said surge breakdown resistance verification rule for verifying surge breakdown resistance on said layout pattern of said output buffer in said output circuit defined by said layout information provided with output circuit information with reference to said surge breakdown resistance rule.

17. A layout pattern verification apparatus in accordance with claim 16, wherein said surge breakdown resistance verification rule includes a first rule related to an area and the shape of a corner portion of an output buffer diffusion region being a diffusion region forming said output buffer.

18. A layout pattern verification apparatus in accordance with claim 17, wherein said surge breakdown resistance verification rule includes a second rule related to a width and area of a contact region provided in said output buffer diffusion region and a margin distance between the same and said output buffer diffusion region.

19. A layout pattern verification apparatus in accordance with claim 18, wherein said surge breakdown resistance verification rule includes a third rule defining a layer to be provided with a power supply wire and a ground wire being connected to said output buffer diffusion region.

20. A layout pattern verification apparatus in accordance with claim 19, wherein said surge breakdown resistance verification rule includes a fourth rule related to geometric positions of said output buffer diffusion region and a peripheral region.

21. A layout pattern verification apparatus in accordance with claim 20, wherein said output buffer diffusion region is a diffusion region being connected to any one of an output pad, a power supply and the ground among diffusion regions forming said output buffer.

22. A layout pattern verification apparatus in accordance with claim 21, wherein said surge breakdown resistance verification means includes:

output buffer verification means for verifying surge breakdown resistance on said layout pattern of said output buffer diffusion region itself being defined by said layout information provided with output circuit information with reference to said first rule of said surge breakdown resistance verification rule, output buffer contact verification means for verifying surge breakdown resistance on a layout pattern related to said contact region of said output buffer diffusion region defined by said layout information provided with output circuit information with reference to said second rule of said surge breakdown resistance verification rule, output buffer interconnection layer verification means for verifying surge breakdown resistance on a layout pattern related to said power supply wire and said ground wire being connected to said output buffer diffusion region defined by said layout information provided with output circuit information with reference to said third rule of said surge breakdown resistance verification rule, and output buffer periphery verification means for verifying surge breakdown resistance on said layout pattern of said output buffer diffusion region and its periphery being defined by said layout information provided with output circuit information with reference to said fourth rule of said surge breakdown resistance verification rule.

23. A layout pattern verification apparatus in accordance with claim 16, further comprising display means for displaying a result of surge breakdown resistance verification on the basis of a result of verification by said surge breakdown resistance verification means.

24. A layout pattern verification apparatus comprising:

layout information providing means for providing layout information obtained by adding device information and circuit connection information to a layout pattern defining the structure of a semiconductor integrated circuit;

input/output circuit information addition means receiving said layout information and identifying an input/output circuit from said layout information for outputting layout information provided with input/output circuit information; and surge breakdown resistance verification means receiving said layout information provided with input/output circuit information for verifying surge breakdown resistance by verifying presence/absence of another wire planarly intersecting with a layout pattern of an input wire and an output wire in said input/output circuit defined by said layout information provided with input/output circuit information.

25. A layout pattern verification apparatus in accordance with claim 24, further comprising display means for displaying a result of surge breakdown resistance verification on the basis of a result of verification by said surge breakdown resistance verification means.

* * * * *